US012046667B2

(12) United States Patent
Udrea et al.

(10) Patent No.: US 12,046,667 B2
(45) Date of Patent: Jul. 23, 2024

(54) III-V SEMICONDUCTOR DEVICE WITH INTEGRATED PROTECTION FUNCTIONS

(71) Applicant: CAMBRIDGE GAN DEVICES LIMITED, Cambourne (GB)

(72) Inventors: Florin Udrea, Cambridge (GB); Loizos Efthymiou, Cambridge (GB); Giorgia Longobardi, Cambridge (GB); Martin Arnold, Cambridge (GB)

(73) Assignee: CAMBRIDGE GAN DEVICES LIMITED, Cambridge (GB)

( * ) Notice: Subject to any disclaimer, the term of this patent is extended or adjusted under 35 U.S.C. 154(b) by 503 days.

(21) Appl. No.: 17/609,368

(22) PCT Filed: May 7, 2020

(86) PCT No.: PCT/EP2020/062699
§ 371 (c)(1),
(2) Date: Nov. 5, 2021

(87) PCT Pub. No.: WO2020/225359
PCT Pub. Date: Nov. 12, 2020

(65) Prior Publication Data
US 2022/0208761 A1    Jun. 30, 2022

(51) Int. Cl.
*H01L 29/778* (2006.01)
*H01L 21/02* (2006.01)
(Continued)

(52) U.S. Cl.
CPC ...... *H01L 29/7786* (2013.01); *H01L 21/0254* (2013.01); *H01L 27/0248* (2013.01);
(Continued)

(58) Field of Classification Search
CPC .......... H01L 27/0883; H01L 29/66462; H01L 29/205; H01L 29/66431; H01L 29/778–7789; H01L 2924/13064
See application file for complete search history.

(56) References Cited

U.S. PATENT DOCUMENTS

2011/0193171 A1   8/2011   Yamagiwa et al.
2011/0309372 A1  12/2011   Xin
(Continued)

FOREIGN PATENT DOCUMENTS

WO    2019/012293 A1    1/2019

OTHER PUBLICATIONS

TW Office Action for corresponding TW Patent Application No. 109115262, with English Translation, dated Aug. 1, 2023, pp. 1-12.
(Continued)

*Primary Examiner* — Amar Movva
(74) *Attorney, Agent, or Firm* — TAROLLI, SUNDHEIM, COVELL & TUMMINO L.L.P.

(57) ABSTRACT

We disclose a Ill-nitride semiconductor based heterojunction power device, comprising: a first heterojunction transistor (19) formed on a substrate, the first heterojunction transistor comprising: a first Ill-nitride semiconductor region formed over the substrate, wherein the first Ill-nitride semiconductor region comprises a first heterojunction comprising at least one two dimensional carrier gas of second conductivity type; a first terminal (8) operatively connected to the first Ill-nitride semiconductor region; a second terminal (9) laterally spaced from the first terminal and operatively connected to the first Ill-nitride semiconductor region; a first gate terminal (10) formed over the first Ill-nitride semiconductor region between the first terminal and the second terminal. The device also includes a second heterojunction transistor (14)
(Continued)

formed on a substrate, the second heterojunction transistor comprising: a second Ill-nitride semiconductor region formed over the substrate, wherein the second Ill-nitride semiconductor region comprises a second heterojunction comprising at least one two dimensional carrier gas of second conductivity type; a third terminal operatively connected to the second Ill-nitride semiconductor region; a fourth terminal laterally spaced from the third terminal in a first dimension and operatively connected to the second Ill-nitride semiconductor region, wherein the fourth terminal is operatively connected to the first gate terminal; and a second gate terminal formed over the second Ill-nitride semiconductor region between the third terminal and the fourth terminal and wherein the second heterojunction transistor is used in sensing and protection functions of the first power heterojunction transistor. The device also includes at least one monolithically integrated current sensing transistor (16) that has a substantially identical structure to the first heterojunction transistor, and
wherein the third transistor is scaled to a smaller area or a shorter gate width when compared to the first heterojunction transistor by a scale factor, X, where X is larger than 1. Other embodiments include both internal and external sensing, sensing loads and a feedback circuit to provide overcurrent, gate over-voltage or over-temperature protection.

16 Claims, 15 Drawing Sheets

(51) Int. Cl.
*H01L 27/02* (2006.01)
*H01L 27/06* (2006.01)
*H01L 27/088* (2006.01)
*H01L 27/095* (2006.01)
*H01L 29/20* (2006.01)
*H01L 29/205* (2006.01)
*H01L 29/66* (2006.01)
*H03K 17/082* (2006.01)

(52) U.S. Cl.
CPC ...... *H01L 27/0605* (2013.01); *H01L 27/0629* (2013.01); *H01L 27/0883* (2013.01); *H01L 27/095* (2013.01); *H01L 29/2003* (2013.01); *H01L 29/205* (2013.01); *H01L 29/66462* (2013.01); *H03K 17/0822* (2013.01); *H03K 2217/0027* (2013.01)

(56) References Cited

U.S. PATENT DOCUMENTS

2016/0056150 A1    2/2016  Nagai
2016/0307886 A1   10/2016  Roberts
2016/0313378 A1   10/2016  Duvjnak
2017/0179834 A1    6/2017  Lin

OTHER PUBLICATIONS

International Search Report and Written Opinion dated May 29, 2020 for corresponding International Application No. PCT/EP2020/062699.

Roberts, et al., John; "Drive and protection methods for very high current lateral GaN power transistors", 2015 IEEE Applied Power Electronics Conference and Exposition (APEC), IEEE, Mar. 15, 2015, pp. 3128-3131, XP032775286.

STATE OF THE ART

STATE OF THE ART

III-V SEMICONDUCTOR DEVICE WITH INTEGRATED PROTECTION FUNCTIONS

RELATED APPLICATIONS

The present invention is a U.S. National Stage under 35 USC 371 patent application, claiming priority to Serial No. PCT/EP2020/062699, filed on 7 May 2020; which claims priority of U.S. patent application Ser. No. 16/405,671, filed on 7 May 2019, the entirety of both of which are incorporated herein by reference.

FIELD OF THE DISCLOSURE

The disclosure relates to power semiconductor devices. Particularly, but not exclusively, the disclosure relates to the use of a hetero-structure AlGaN/GaN high electron mobility transistor or rectifier.

BACKGROUND OF THE DISCLOSURE

A power semiconductor device is a semiconductor device used as a switch or rectifier in power electronics. A power semiconductor device is usually used in "commutation mode" (i.e., it is either on or off), and therefore has a design optimized for such usage.

Silicon bipolar junction transistors (BJT), Metal-Oxide-Semiconductor field effect transistors (MOSFET) and insulated gate bipolar transistors (IGBT) are common types of power semiconductor switching devices. Their application areas range from switch mode power supplies for consumer electronics, electric cars, motor control and power supplies to RF and microwave circuits and telecommunication systems.

Gallium Nitride (GaN) is a wide band gap material with properties that make it a suitable candidate for use in several fields of application (e.g. radio-frequency electronics, optoelectronics, and power electronics) which require solid-state devices.

GaN technology allows transistors with high electron mobility and high saturation velocity to be designed. These properties of GaN have made it a good candidate for high-power and high-temperature microwave applications, for example radar and cellular communications systems. As systems expand in subscribers and desired capacity, interest in increasing their operating frequency and power has grown correspondingly. Higher frequency signals can carry more information (bandwidth) and allow for smaller antennas with very high gain.

Additionally, GaN with its wide bandgap offers the potential for emitting light at higher frequencies for example the green, blue, violet, and ultraviolet portions of the electromagnetic spectrum.

In the last decade, Gallium Nitride (GaN) has increasingly been considered as a very promising material for use in the field of power devices. The application areas range from portable consumer electronics, solar power inverters, electric vehicles and power supplies. The wide band gap of the material ($E_g$=3.39 eV) results in high critical electric field ($E_c$=3.3 MV/cm) which can lead to the design of devices with a shorter drift region, and therefore lower on-state resistance, if compared to a silicon-based device with the same breakdown voltage.

The use of an Aluminium Galium Nitride (AlGaN)/GaN heterostructure also allows the formation of a two-dimensional electron gas (2DEG) at the hetero-interface where carriers can reach very high mobility ($\mu$=2000 cm$^2$/(Vs)) values. In addition, the piezopolarization charge present at the AlGaN/GaN heterostructure, results in a high electron density in the 2DEG layer (e.g. 1e$^{13}$ cm$^{-2}$). These properties allow the development of High Electron Mobility Transistors (HEMTs) and Schottky barrier diodes with very competitive performance parameters. An extensive amount of research has focused on the development of power devices using AlGaN/GaN heterostructures.

However, the 2DEG which inherently exists at the AlGaN/GaN hetero-interface creates a challenge when attempting the design of enhancement mode rather than depletion mode devices. Nonetheless, several methods have been proposed which can lead to enhancement mode devices, among them the use of metal insulator semiconductor structures, use of fluorine treatment, recessed gate structures and use of a p-type cap layer. Due to the relative maturity and controllability in the epitaxial growth of pGaN layers compared to the other techniques, pGaN/AlGaN/GaN HEMTs are currently the leading structure for commercialization.

FIG. 1 shows a cross section of the active area of a state of the art pGaN HEMT. The device includes an AlGaN layer 1, a GaN layer 2, a transition layer 3, a silicon substrate 4, a substrate terminal 5, a SiO$_2$ passivation 6, a source terminal 8, a drain terminal 9, a gate terminal 10, and a highly p-doped GaN 11. The device shown is a lateral three-terminal device with an AlGaN/GaN heterostructure grown epitaxially on a standard silicon wafer. The transition layer is used to allow a high quality GaN layer to be grown despite the significant lattice mismatch between GaN and Si. Carbon p-type doping is often added in the GaN layer. Finally, a thin cap GaN layer is typically added to form the gate with a Magnesium (Mg) p-type doping density greater than 1×10$^{19}$ cm$^{-3}$. A typical pGaN gate device has a threshold voltage of ~1.5-2V and gate turn-on bias voltage of ~8V.

While an enhancement mode device is used in a lot of power electronic applications as the main power switch, there are other applications where a depletion mode device can be more suitable. In general, a depletion mode AlGaN/GaN transistor is made by placing a Schottky metal contact 12, which acts as the gate terminal, directly on the AlGaN layer (excluding the p-GaN cap layer which exists in the enhancement mode devices) as seen in FIG. 2.

In state of the art devices, there is a trend to integrate more functions and more devices, such as transistors, into a single chip to fabricate smaller, smarter, and more powerful systems. The combination and integration of enhancement and depletion mode transistors is a key enabler for advanced logic, analog and digital circuits.

In power electronics there is often a need for protection and sensing circuitry (e.g. current sensing, over-voltage protection, temperature sensing) to be integrated monolithically with the main, often enhancement mode, power switch. Monolithic integration of such functionality rather than a discrete implementation would allow a reduction in the overall system size/costs, a reduction in the bill of material and would lead to improved performance through the reduction of parasitic components associated with the interconnections between discrete devices. In such sensing and protection circuitry, there is often the need of using a depletion mode or normally-on device.

The state of the art does not offer the ability to form the gate terminal of both an enhancement mode and depletion mode device within the same fabrication step. In state of the art devices the Schottky contact is formed in a separate fabrication step.

In state of the art depletion mode Schottky gate devices, the threshold voltage of the device (i.e. the gate bias voltage at which the device is considered to move from the off-state to the on-state and vice versa) is dependent on process parameters such as, but not limited to, the AlGaN layer thickness, aluminium mole fraction and gate metal stack. Therefore, to adjust the threshold voltage to a level which is most suitable for a specific application would require a change in the epitaxial growth and/or the gate metal processing, which is time consuming and not cost efficient. The ability to reliably adjust the device threshold voltage through layout modifications would be significantly less time consuming and more cost efficient in comparison. Such capability does not currently exist in the state of the art.

State of the art depletion mode devices in the on-state have a limit on the maximum positive gate bias voltage which can be applied on the gate terminal before the main on-state conduction path (i.e. low resistance path) changes from drain-source to gate-source. This maximum bias voltage depends on the Schottky barrier height present at the gate contact and does not exceed 2V. A depletion mode HEMT device which can be biased beyond this voltage level does not exist in the state of the art.

SUMMARY

The present disclosure relates to semiconductor structures and devices formed in Group III nitrides and more specifically GaN and $Al_xGaN_{1-x}$ structures.

According to this disclosure, there is provided protection and sensing circuitry for the main, often enhancement mode, power switch, using a monolithically integrated current sensing transistor and preferably at least one depletion mode device. The ability to sense the current through the main power HEMT, via a current sensing transistor and using that to adjust the gate bias or the gate pulse width/frequency of the main power HEMT can be used to avoid drain over-current events on the load side or offer longer endurance time during a short-circuit condition. The arrangement may also be based on a monolithically integrated (internal) feedback circuit to provide the self-protection and/or a sensing pad to allow external sensing of the current and processing of this through controller/micro-processor and agate driver units to provide an external feedback to the gate of the main power HEMT to optimise its operation and/or provide self-protection. Moreover, if the integrated sensing load has a reproducible temperature dependence, it can be used to provide both over-current and over-temperature protection. This is particularly useful when over self-heating occurs. Monolithic integration of such functionality rather than a discrete implementation allows a reduction in the overall system size/costs, a reduction in the bill of material and can lead to improved performance through the reduction of parasitic components associated with the interconnections between discrete devices.

According to this disclosure, there is provided a semiconductor device in GaN technology with an integrated sensing and protection circuit where the main power transistor and transistors used for sensing and protection may be made using the same gate technology. The drain and gate terminals of the current sensing transistor are connected to the drain and the gate terminals of the main power HEMT respectively. The drain terminal of at least one of the other transistors used in the sensing and protection circuit may be connected to the gate terminal of the main power transistor. Different implementations of other sensing and protection circuits are included to mitigate over-current and over-temperature events.

The depletion mode transistor, according to this disclosure, may contain a gate structure based on a discontinuous p-GaN layer containing islands within stripes or closed shapes around the cells that act to modulate the conductive path between the high voltage terminal and low voltage terminal, when a gate voltage is provided and may be used in the protection circuits. All such islands may be connected to the same gate electrode. By discontinuous islands we mean that between adjacent islands there is no p-GaN layer present, and as such, there is a direct, unobstructed conductive path between the source and the drain terminals, through the 2DEG layer formed at the heterojunction between GaN and AlGaN, in between the islands. However, adjacent islands may be placed close together across (orthogonal to) the current path such that the potential applied to the p-GaN gate islands modulates the conductive region between the islands (the 2DEG layer) and thus modulate the direct path between the source and the drain. The p-GaN layers in the continuous and discontinuous gate structures may be manufactured in the same process step and the difference between continuous and discontinuous is realized by a layout change of the same mask.

According to one aspect of this disclosure, there is provided a sensing and protection circuit which may preferably use one depletion mode transistor as described above. The depletion mode transistor senses a specific own gate voltage or/and drain current and acts to lower or limit the gate voltage on the main power transistor when a condition of over drain current (or over-temperature) is detected in the main power transistor. The specific on-state gate voltage is equal to the voltage at which a two dimensional electron gas (2DEG) is formed under the p-GaN islands and results in a steep increase in current (i.e. decrease in the on-state resistance) of the normally on sensing device.

According to a first aspect of this invention there is provided a III-nitride semiconductor based heterojunction power device, comprising:
   a first power heterojunction transistor formed on a substrate, the first heterojunction transistor comprising:
      a first III-nitride semiconductor region formed over the substrate, wherein the first III-nitride semiconductor region comprises a first heterojunction comprising at least one two dimensional carrier gas of second conductivity type;
      a first terminal operatively connected to the first III-nitride semiconductor region;
      a second terminal laterally spaced from the first terminal and operatively connected to the first III-nitride semiconductor region;
      a first gate region formed over the first III-nitride semiconductor region between the first terminal and the second terminal;
      a first gate terminal contacting the first gate region,
   a second heterojunction transistor formed on a substrate, the second heterojunction transistor comprising:
      a second III-nitride semiconductor region formed over the substrate, wherein the second III-nitride semiconductor region comprises a second heterojunction comprising at least one two dimensional carrier gas of second conductivity type;
      a third terminal operatively connected to the second III-nitride semiconductor region;
      a fourth terminal laterally spaced from the third terminal in a first dimension and operatively connected to the second III-nitride semiconductor region, wherein the fourth terminal is operatively connected to the first gate terminal; and
a second gate region, formed over the second III-nitride semiconductor region between the third terminal and the fourth terminal;
a second gate terminal contacting the second gate region,
a third heterojunction transistor formed on a substrate, the third heterojunction transistor comprising:
a third III-nitride semiconductor region formed over the substrate, wherein the third III-nitride semiconductor region comprises a third heterojunction comprising at least one two dimensional carrier gas of second conductivity type;
a fifth terminal operatively connected to the third III-nitride semiconductor region;
a sixth terminal laterally spaced from the fifth terminal in a first dimension and operatively connected to the third III-nitride semiconductor region, wherein the sixth terminal is operatively connected to the second terminal; and
a third gate region, formed over the third III-nitride semiconductor region between the fifth terminal and the sixth terminal;
a third gate terminal contacting the third gate region, wherein the third gate terminal is operatively connected to the first gate terminal, and
wherein the third heterojunction transistor is monolithically integrated with the first heterojunction transistor and has a substantially identical structure to the first heterojunction transistor, and wherein the third transistor is scaled to a smaller area or a shorter gate width when compared to the first heterojunction transistor by a scale factor, X, where X is larger than 1 and,
wherein the third heterojunction transistor is used in current sensing of the first power heterojunction transistor and the second heterojunction transistor is configured to be used in sensing and/or protection functions of the first power heterojunction transistor.

According to a second aspect of this invention there is provided a III-nitride semiconductor based heterojunction power device, according to claim 1,
wherein the first heterojunction transistor further comprises a first one or plurality of highly doped semiconductor regions of a first conductivity type formed over the first III-nitride semiconductor region, and wherein the first gate terminal is formed over the first one or plurality of highly doped semiconductor regions; and
wherein the second heterojunction transistor comprises at least two highly doped semiconductor regions of the first conductivity type formed over the second III-nitride semiconductor region, and wherein the second gate terminal is formed over the at least two highly doped semiconductor regions and wherein the at least two highly doped semiconductor regions are laterally spaced from each other in a second dimension.

The second heterojunction transistor may be a normally-on transistor based on a discontinuous p-GaN layer containing islands within stripes or closed shapes around the cells that act to modulate the conductive path between the high voltage terminal and low voltage terminal, when a gate voltage is provided.

According to a third aspect of the disclosure the sensing and protection functions may refer to both sensing of the current through the current sensing transistor (third transistor) and use the second transistor for sensing the first gate terminal voltage of the power heterojunction transistor and as a result of either of the sensing functions, limiting the voltage applied to the first gate of the power heterojunction transistor.

According to a fourth aspect of the disclosure the sensing and protection functions may be both internal and external. In this aspect of the invention at least one current sensing transistor is provided. The at least one current sensing transistor provides double sensing, internal and external. The internal current sensing is done through an integrated sensing load further connected to an integrated feedback circuit for self-protection against over-currents. The feedback circuit may comprise transistor such as the second transistor described in the previous aspects of this invention. The sensing load may comprise integrated resistors, made for example of 2DEG or metals, or other active elements such as depletion mode or enhancement mode transistors. If the sensing load has a reproducible temperature dependence, the feedback circuit could also provide self-protection against over-heating. The external sensing is provided as an output (via an integrated sensing pad) in the form of a current or voltage ideally proportional to the current flowing through the main power HEMT, to a controller/microprocessor for further processing. The controller/micro-processor may instruct the internal/external gate driver unit to provide an external feedback to the gate of the main power HEMT to optimise its operation and/or provide self-protection. The internal feedback circuit may further comprise amplifying elements to enhance its sensing and protection performance.

It is an object of the disclosure to provide a semiconductor device preferably using GaN technology, with an integrated sensing and protection circuit where the main power transistor which preferably uses a gate structure based on a continuous p-GaN layer, and transistors used for sensing are made using the same gate technology preferably featuring continuous or discontinuous p-GaN layers Different implementations of protection circuits are described to mitigate drain over-current, over-heating or over gate voltage events. This helps with a rugged operation and increased safe operating area.

The second heterojunction transistor, the sensing load and/or other parts of the feedback circuit and may be formed on the same substrate and using virtually all the same GaN based layers as the first heterojunction power transistor, but placed in a different area of the integrated chip. The first heterojunction transistor could be in this case monolithically integrated with the second heterojunction transistor and the third heterojunction transistor and may also contain some other monolithically integrated components such as resistors, capacitors, transistors or diodes belonging to the sensing load or the feedback circuit. The monolithic integration of the components described above allows a reduction in the overall system size and costs. It also leads to improved performance through the reduction of parasitic components associated with the interconnections between discrete devices.

Preferably, the starting substrate may be silicon. However, any other substrate combining silicon with another semiconducting material compatible with state-of-the-art fabrication processes may be used. Employment of a silicon substrate facilitates etching techniques, low cost, high reproducibility, and wide availability of foundries supporting the process. Alternative substrate materials may include sapphire, silicon carbide (SiC), gallium nitride (GaN), and gallium arsenide (GaAs). Other alternatives may also be possible. Also, this disclosure covers the possibility of growing the III-nitride semiconductor region comprising the heterojunction (or heterostructure) on a first substrate suitable for the purpose and then transferring the heterostructure on a second substrate. The second substrate might be any of the previously mentioned substrates or a different one (e.g. a polydimethylsiloxane, PDMS, flexible substrate, diamond). Silicon as substrate material will be used for illustrative purposes in the embodiments hereafter and in the accompanying drawings.

The first heterojunction transistor may further comprise a first one or plurality of highly doped semiconductor regions of a first conductivity type formed over the first III-nitride semiconductor region, and the first gate terminal may be formed over the first one or plurality of highly doped semiconductor regions. The second heterojunction transistor may comprise a second one or plurality of highly doped semiconductor regions of the first conductivity formed over the second III-nitride semiconductor region, and the second gate terminal may be formed over the second one or plurality of highly doped semiconductor regions. It will be understood that both first and second highly doped regions can be one continuous region or a plurality of discrete regions. The disclosure covers both scenarios. The third heterojunction transistor (the current sensing transistor) or the at least one current sensing transistor may have a substantially identical structure to the first heterojunction transistor, and wherein the third transistor is scaled to a smaller area or shorter gate width when compared to the first heterojunction transistor by a scale factor, X, where X is larger than 1. All the transistors, but preferably the first power transistor and the third transistor (or the at least current sensing transistor) may be based on a finger shape in an inert-digitated design.

The first gate terminal may be formed over the first plurality of highly doped semiconductor regions. The second gate terminal may be formed over the second plurality of highly doped semiconductor regions. The first gate terminal and/or the second gate terminal may comprise an Ohmic contact. Alternatively, the first gate terminal and/or the second gate terminal may comprise a Schottky contact.

The first heterojunction of the first III-nitride semiconductor region may comprise: a first III-nitride semiconductor layer having a first band gap formed over the substrate; a second III-nitride semiconductor layer having a second bandgap different from the first band gap disposed on the first III-nitride semiconductor layer; and at least one two-dimensional carrier gas of the second conductivity type formed at the interface between the first and second III-nitride semiconductor layers to provide a channel. The second heterojunction of the second III-nitride semiconductor region may comprise: a third III-nitride semiconductor layer having a first band gap formed over the substrate; a fourth III-nitride semiconductor layer having a second bandgap different from the first band gap disposed on the first III-nitride semiconductor layer; and at least one two-dimensional carrier gas of the second conductivity type formed at the interface between the third and fourth III-nitride semiconductor layers to provide a channel.

Each of the first III-nitride semiconductor layer, second III-nitride semiconductor layer, third III-nitride semiconductor layer, and fourth III-nitride semiconductor layer may comprise any one of gallium nitride (GaN), aluminium gallium nitride (AlGaN) and indium aluminium gallium nitride (InAlGaN).

The heterostructures may comprise elemental semiconductors (e.g. Si, Ge), binary compounds from Group III and Group IV (e.g. GaAs), or Group II and Group VI (e.g. ZnS), or Group III and Group V (e.g. GaN), binary alloy semiconductors (e.g. SiGe), ternary alloys (e.g. AlGaAs), quaternary alloys (e.g. InGaAsP) or even pentary materials (e.g. GaInPSbAs). Some examples of possible heterostructures thus follow: AlGaAs/GaAs, InGaP/GaAs, InP/InGaAs, InAlAs/InGaAs, SiGe/Si, AlGaAs/InGaAs, InAlAs/InGaAs and InAlN/GaN, AlGaN/GaN. Preferably the heterostructures will be an AlGaN/GaN heterostructures comprising a two dimensional electron gas (2DEG); this will be used for illustrative purposes in the embodiments hereafter and in the accompanying drawings. GaN and AlGaN technology allows transistors with high electron mobility and high saturation velocity to be designed.

The at least one two dimensional carrier gas may be a two dimensional electron gas (2DEG) or a two dimensional hole gas (2DHG), the former being preferable because of the very high electron mobility.

The first plurality of highly doped semiconductor regions may comprise a single continuous highly doped region of p-type conductivity corresponding to a device featuring a 2DEG or n-type conductivity corresponding to a device featuring 2DHG. Alternatively, the first plurality of highly doped regions may comprise at least two discrete highly doped semiconductor regions of p-type conductivity corresponding to a device featuring a 2DEG or n-type conductivity corresponding to a device featuring 2DHG.

The second plurality of highly doped semiconductor regions may comprise a single continuous highly doped region. Alternatively, the second plurality of highly doped semiconductor regions may comprise at least two highly doped semiconductor regions laterally spaced from each other in a second dimension.

The highly doped semiconductor regions (islands) may be placed on the semiconductor surface of the heterojunction and at zero gate-source terminal bias they create a depletion of the conductive channel (2D carrier gas) directly under it. An uninterrupted channel is present at zero gate-source bias between the third (source) and fourth (drain) terminals along the paths where the highly doped layer is not present (on the 2D carrier gas formed under the region between the islands). This uninterrupted channel is present as long as the gate-source bias is greater than the first threshold voltage.

With a more negative bias applied to the gate terminal with respect to the source terminal, the carrier concentration in the conductive channel (region) between the drain and source terminals is reduced due to electric field extending from the highly doped islands to the region between the islands. This lateral field depletes the 2D carrier gas formed under the region between highly doped semiconductor islands and thus obstructs the current path through the 2D carrier gas resistance between the source (third terminal) and the drain (fourth terminal). The critical gate bias value at which the device is considered to move from the on-state (low resistance) to the off-state is defined as the first threshold voltage or the device threshold voltage. Note that instead of applying a negative potential to the gate with respect to the source terminal, it is also possible to keep the gate grounded and applying a positive potential to the source with the same result.

Each of the highly doped semiconductor regions may be spaced from the nearest other highly doped semiconductor region. The threshold voltage may be controlled by the separation between adjacent highly doped islands, layer thicknesses, and doping fractions. The specific on-state resistance of the depletion mode transistor may be controlled by the number of separations between highly doped islands and the width (in the second dimension) of the highly doped islands with respect to the separation (i.e. pitch) between the islands.

The at least two highly doped semiconductor regions may comprise discrete regions, wherein each of the at least two highly doped semiconductor discrete regions may be separated from the nearest other highly doped semiconductor regions by a predetermined distance (i.e. pitch). The discrete regions (or discontinuous islands) may be formed such that between adjacent islands there is no highly doped semiconductor layer present, and as such, there is a direct, unobstructed conductive path between the third terminal (source) and the fourth terminal (drain) provided by an undepleted 2D carrier gas layer. Adjacent islands may be placed close together in a line across (and orthogonal to) the current path, such that the potential applied to the gate modulates the conductive region (i.e. the portion of the 2D carrier gas layer) between the islands and thus modulates the direct path between the source and the drain.

The at least two highly doped semiconductor regions may be aligned in the first dimension. In other words, the at least two highly doped semiconductor regions may form a line of highly doped semiconductor regions extending in the second dimension, in a different direction to the current flow between the first terminal and the second terminal.

The second heterojunction transistor may be configured as a depletion mode field effect transistor. In other words, the second heterojunction transistor may be configured as a normally-on transistor as described above.

The depletion mode transistor may have two threshold voltages. The first threshold voltage may be negative and may be equivalent to that of a classical normally-on transistor, indicating the transition from the off-state to the on-state. Preferably, the second threshold voltage may be positive and may be characterised by a steep current increase. The second threshold voltage can occur at the same value as that of the integrated normally-off device featuring a continuous highly doped semiconductor gate.

When the gate voltage of the depletion mode transistor is very negative, the adjacent highly doped semiconductor gate islands deplete the portion of the 2D carrier gas between them, obstructing the path for electrons or holes to flow from the source to drain. Once the gate-source voltage is equal or greater than the first threshold voltage, the 2D carrier gas starts forming at the middle of the pitch between adjacent p-islands. At this stage a conductive path is established between the source and drain. The value of the first threshold voltage can be adjusted by controlling the pitch between adjacent highly doped semiconductor islands. As the gate-source voltage is increased above the first threshold voltage but remaining below the second threshold voltage, the formation of the 2D carrier gas channel spreads from the middle of the pitch between adjacent highly doped semiconductor islands towards the edges of the highly doped semiconductor gate islands. The current continues to increase as the on-state resistance is reduced. When the second threshold voltage (which is preferably positive) is reached, a steep increase in the current is seen as the 2D carrier gas spreads under the p-gate islands allowing the current to flow through this region, thus resulting in an increase conduction area. This is characterised by a steep increase in current and, as a result, a steep decrease in the on-state resistance. The rate of the current increase depends on the ratio between the width of the highly doped semiconductor gate islands and the pitch between them.

The depletion mode transistor which may contain a gate structure based on discontinuous p-GaN layer of islands within stripes or closed shapes around the cells senses a specific own gate voltage or/and drain current and acts to lower or limit the gate voltage on the main power transistor when a condition of over drain current and/or over-temperature or a condition of over-current and/or over-gate voltage is detected in the main power transistor. The specific on-state gate voltage is equal to the voltage at which a two dimensional electron gas (2DEG) is formed under the p-GaN islands and results in a steep decrease in the on-state resistance of the normally on, depletion mode transistor.

The at least two highly doped semiconductor regions may comprise a p-type gallium nitride (p-GaN) material. The pGaN forms a barrier with the AlGaN material underneath. The high doping of the pGaN facilitates a depletion region to penetrate the AlGaN layer to reach the 2DEG, function of the potential applied to the gate terminal with respect to the source terminal. Hole tunnelling occurs from the gate terminal into the semiconductor when the potential on the gate is increased. A certain amount of hole current through the gate has a positive effect on the stability of the device during dynamic high voltage stress, but if the gate current is too high this is seen as leakage in the control terminal affecting the driver and the total losses of the device. It is apparent that the use of a pGaN gate is what creates the depletion of the 2DEG underneath it at zero gate bias and thus allows the design of a normally-off (enhancement mode) device. (an n-doped region would not act in the same way).

The device may further comprise a transition layer formed between the substrate and the first III-nitride semiconductor region or the second III-nitride semiconductor region. The transition layer may be present between the heterostructure and the bulk substrate to minimise the lattice mismatch or accommodate the mechanical stress in the heterostructure. The transition layer may comprise a nucleation layer. The nucleation layer may be made of Aluminium Nitride (AlN) or any other suitable material, and may be placed on the substrate. The nucleation layer may form the first sub-layer of a transition layer made of different sub-layers containing the same materials as the first and second semiconductor layers of the heterostructure device (for example AlGaN or GaN materials). This helps to release the mechanical stress and accommodate the lattice mismatch between the substrate (for example silicon) and the heterostructure formed on top.

In embodiments of the disclosure where the substrate is silicon and the heterostructure is based on III-Nitride compounds such as GaN, the transition layer may comprise a single layer of $Al_xGaN_{1-x}N$ (x being the aluminium mole fraction of the compound) or any composition of $Al_xGaN_{1-x}N/Al_yGaN_{1-y}N$ (y being the aluminium mole fraction of the compound) creating a multilayer stack, also known as superlattice.

The heterojunction power device may further comprise an isolation layer formed between the first heterojunction transistor and the second heterojunction transistor. Other isolation layers can be used to isolate different components in the integrated heterojunction chip. Such components may be part of the sensing load or feedback circuit.

The second heterojunction transistor may form part of a sensing and protection circuit for the first heterojunction transistor. The second heterojunction transistor may be integrated with the first heterojunction transistor whereas the rest of the sensing and protection circuit may not be monolithically integrated with the first heterojunction transistor, but provided within the same package or a separate package.

Alternatively, the entire sensing and protection circuit may be monolithically integrated with the first heterojunction transistor.

According to the first aspect of the disclosure the sensing and protection functions refer to the sensing of the current flowing through the first power heterojunction transistor by using the third transistor and limiting or adjusting the gate signal supplied to the gate of the first power heterojunction transistor.

In prior-art sensing of the current in the main power transistor can be done by using a resistor attached to the first terminal (source) and monitoring the voltage developed across this resistor. This however leads to an increased potential in the source of the power device resulting in both lower effective gate to source voltage applied to the main transistor and additional losses through the power dissipated in the resistor.

Instead, as described in this invention, it is better to use a current sensing device monolithically integrated with the power switch. The current sensing transistor has an area (or gate width) much smaller than that of the first power heterojunction transistor. In this case the current flowing the current sensing transistor is proportional to the current flowing in the first power heterojunction transistor but significantly smaller.

According to the first aspect of this disclosure, the current sensing transistor (the third transistor) may be identical in terms of structure but the main power transistor having a much larger active area or gate width than the current sensing transistor (e.g. by a factor of 10×, 100×, 1000×). The two transistors may have the drains connected together and the gates connected together but separate source terminals. The current sensing transistor may be used to sense the current flowing through the source of the main power transistor.

The second gate terminal of the second heterojunction transistor described in the first aspect of this disclosure may be operatively connected to the source terminal of the current sensing transistor. In other words, the source of the current sensing transistor, and the gate of the second heterojunction transistor may be connected. As described in the first aspect of this disclosure, the gate of the first power transistor is connected to the drain of the second heterojunction transistor.

The device may further comprise a first resistor (current sensing resistor) or a sensing load. The second gate terminal (the gate of the second transistor) may be operatively connected to the source of the current sensing transistor and the first terminal of the resistor, or the sensing load. The second terminal of the first resistor or sensing load may be operatively connected to the source terminal of main power transistor. Alternatively, the second terminal of the first resistor or the sensing load may be operatively connected to a ground terminal.

The first resistor or sensing load may be monolithically integrated with the first power transistor and the second transistor, for example, the first resistor may comprise a 2DEG layer or a metal layer. Alternatively, the first resistor may be external to the first power transistor and the second transistor. The sensing load may comprise integrated resistors or other low-voltage heterojunction transistors, such as depletion-mode or enhancement-mode HEMTs.

As the current through the first resistor (or sensing load) increases, the second gate voltage of the second transistor is elevated and the equivalent on-resistance of the second transistor may decrease providing a reduction in the resistance of the path between the first gate terminal and the source terminal of the main power transistor. This limits the potential on the first gate terminal. The circuit can then act as protection from a drain over-current event, occurring in the first power device.

The device may further comprise a sensing pad and a second terminal of the first resistor or sensing load may be connected to the sensing pad such that the current through the current sensing transistor can be measured. This can be used both internally or externally to determine the current in the main power transistor, by using the scale factor of the active areas of the two transistors and the size of the first resistor.

The device may further comprise a second resistor. The second resistor may form a potential divider with the first resistor. The choice of resistances for the two resistors allows an easy adjustment of the maximum current level possible between the drain and source terminals of the main power transistor.

The second heterojunction transistor may be configured as an enhancement mode transistor. The potential at the gate terminal of the enhancement mode transistor may increase as the current through the current sensing (first) resistor is increased, raising the potential on the gate of the second enhancement mode transistor and thus adjusting its resistance. A critical current through the first power transistor can turn on the second enhancement mode transistor limiting the potential on the gate of the main power transistor. The circuit described can act as protection from a drain over-current event occurring in the first power device.

The second heterojunction transistor may be configured as a depletion mode transistor. When no current is present in the first power device, the gate of the second transistor is grounded, but because of the normally-on nature, the current still flows through the depletion mode transistor. In this mode the second heterojunction transistor acts as a resistive load between the gate and the source of the first main power device. The potential at the gate terminal of the second heterojunction transistor may increase as the current through the current sensing (first) resistor is increased, thus raising the potential on the gate of the second heterojunction transistor. A critical current through the first power transistor can lead to a potential higher than the second threshold voltage of the normally-on transistor. This results in a steep decrease of the on-resistance of the second heterojunction transistor which in turn leads to limiting of the potential on the gate of the main power transistor. The circuit described here can act as protection from a drain over-current event occurring in the first power device.

According to a third aspect of the disclosure the sensing and protection functions may refer to both sensing of the current through the first terminal of the first power heterojunction transistor and sensing the first gate terminal voltage of the power heterojunction transistor and as a result of either of the sensing functions, limiting the voltage applied to the first gate of the power heterojunction transistor.

In this aspect of the disclosure, the second transistor, configured as a normally-on device, may further comprise a third gate terminal (so that the second transistor has two gates itself). The second gate terminal may be connected to a midpoint of the potential divider; and the device may further comprise a first resistor and wherein the third gate terminal is connected to a first terminal of the resistor. In other words, the second transistor may be a double gate transistor.

The second heterojunction transistor may comprise at least two pluralities of highly doped semiconductor regions of a first conductivity type, and the second gate terminal may be formed over one plurality of highly doped semiconductor regions, wherein third gate terminal may be formed over another plurality of highly doped semiconductor regions. Each of the pluralities of highly doped semiconductor regions may comprises at least two highly doped semiconductor regions laterally spaced from each other in a second dimension. In other words, the double gate transistor may have two gates with discontinuous p-GaN gate islands, as described above.

A normally-on (depletion mode) transistor with a double gate may be used as the second transistor, with the first gate connected to the mid-point of the potential divider described above and the second gate connected to the resistor/resistive load attached to the current sensor device. In this case if one condition or the other (over-current detection in the first main power device or over gate voltage detection in the first main power device) occurs, a steep decrease in the on-state resistance of the second heterojunction transistor is triggered, pulling the gate potential lower until one of the conditions (over-current detection or over gate voltage-detection) is no longer detected. This results in limiting the gate voltage to a desired level for increased safe operating area and robustness.

According to the third aspect of this disclosure the device may further comprise a potential divider. A terminal of the potential divider may be connected to the first gate terminal (of the main power transistor) and a mid-point of the potential divider may be connected to part of the second gate terminal of a second heterojunction transistor which, in this case, is configured as a normally-on (depletion mode) transistor and has two gate control terminals. The potential divider may be integrated with the first power transistor and the second transistor for example, as a 2DEG layer. Alternatively, the potential divider may be formed of external resistors or resistive loads. The second part of the gate terminal could be connected to the sensing resistor or the sensing load and source of the third heterojunction transistor (the current sensing transistor).

The second transistor may be used to lower or limit the gate voltage on the main power (first) transistor when a condition of either over-current or over gate voltage is detected in the main power transistor.

The potential divider may comprise at least two resistors in series. The at least two resistors of the potential divider may each comprise a two-dimensional electron gas (2DEG).

The heterojunction power device may comprise a voltage limiting circuit composed of two resistors forming a potential divider and an actively switched low voltage depletion mode (second) transistor. The drain source path of the actively switched low voltage depletion mode transistor may be connected between the gate and source of the main power transistor and in parallel with the potential divider. The mid-point of the potential divider may be connected to the gate terminal of the second (low voltage) depletion mode transistor. In this embodiment, the resistance of the depletion mode transistor can be reduced, and thus adjusts the resistance between the main power device gate terminal and the main power device source terminal, when the potential of the main power device gate terminal is increased. The potential divider formed by the resistors may determine the potential on the gate terminal of the depletion mode transistor. The circuit described can protect the main power gate terminal (of the first power device) from over gate voltage events.

According to a fourth aspect of this disclosure, there is provided a heterojunction chip comprising a first power heterojunction transistor (as main transistor) and at least one current sensing transistor where the at least one current sensing transistor provides double current sensing, one for internal use for self-protection against over-currents or over-temperatures and one for external use for optimising the drive/control of the first power heterojunction transistor or for additional protection against over-currents or over-temperature.

The at least one current sensing transistor could be the third transistor as described in the previous aspects of this invention. The at least one current sensing transistor has an identical structure to the first power heterojunction transistor but scaled to a known, much smaller active area or gate width when compared to the active area or the gate width of the first power heterojunction transistor respectively (by a factor X where X is much larger than 1). The at least one current sensing transistor is monolithically integrated within the Heterojunction chip. The at least one current sensing transistor has the drain and the gate terminals connected to the drain and gate terminals of the first power heterojunction transistor respectively.

The at least one current sensing transistor can be used:
 (i) for internal protection using a resistor load or sensing load connected to its source terminal and an additional monolithically integrated feedback circuit to provide locally a signal to the gate, as to lower or limit its gate voltage amplitude or pulse width of the switching frequency when a certain current limit is reached in the first power heterojunction transistor and,
 (ii) to send a signal (in the form of current or voltage) to an external controller/micro-processor as to optimise the drive/control of the first power heterojunction transistor and/or to additionally protect the first power heterojunction transistor by providing through the driver circuit a control of the gate signal.

The feedback circuit could comprise the second transistor as described in the previous aspects of this invention.

By "external device/circuit/component", one understands a device/circuit/component that is not monolithically integrated with the heterojunction chip, but may be in a different package or co-packaged with the heterojunction chip. Such a device/circuit/component may be made in Silicon or in a standard material. The driver circuit (gate driver) could be external or could be monolithically integrated within the heterojunction chip. Alternatively, parts of the gate driver could be internal to provide an interface to the first power heterojunction transistor and part of the gate driver could be external and made for example in cheaper materials such as silicon. Advantageously the controller/micro-processor could be external, as this allows high performance at very low cost.

According to one embodiment of the fourth aspect of this disclosure, the double current sensing is performed through two or more separate, integrated current sensing transistors, each of the current sensing transistors providing either an internal current sensing and protection function or an external current sensing and/or protection function. The two or more current sensing transistors could be identical or not. The two or more current sensing transistors could comprise one or several fingers in a multi-finger device layout. For example, one current sensing transistor may comprise one finger, the second current sensing transistor may comprise a two-finger structure while the first power heterojunction transistor could comprise several fingers (one to three orders of magnitude larger number of such fingers e.g. 100 fingers or 1000 fingers).

In this embodiment the current sensing transistors that aims to provide external current sensing and/or protection, could be connected to an external precision resistor. The precision resistor would not be affected by the manufacturing tolerances of the fabrication process used for making heterojunction devices and could be less affected or virtually unaffected by the temperature variations in the first power heterojunction transistor or the ambient. The voltage drop across this precision resistor could provide a more accurate estimation of the real current in the first power heterojunction transistor. The voltage across this external resistor or directly the current through the current sensing transistor that aims to provide external current sensing and/or protection could feed into a controller/microprocessor unit that can further analyse it and instruct the gate driver to limit or adjust (in amplitude or time, or pulse width or the frequency or duty cycle) the signal applied to the gate driver as to optimise the system operation and protect the first power heterojunction transistor or the system where the heterojunction chip is part of.

The current sensing transistor that aims to provide internal current sensing and protection, could have its source terminal connected to the first terminal of an internal (integrated) resistor or sensing load. The sensing load may be formed by a resistor or a resistor load or a monolithically integrated low voltage transistor or a series and/or parallel combination of a resistor and at least one monolithically integrated low voltage transistor. The gate of the low voltage transistor could be connected to its drain or source or to the source of the first power heterojunction transistor or to any other node of the sensing load. Alternatively, the gate of the low voltage transistor of the sensing load could be connected to the gate of the first power heterojunction transistor. The use of a combination of series and/or parallel resistors in the sensing load connected together with a low voltage normally-on or normally-off transistor could provide some compensation for the loss of linearity of the current in the current sensing transistor divided by the current on the first power heterojunction transistor at large currents flowing in the heterojunction chip. This loss in linearity could be due to the temperature increase caused by the self-heating effect in the first power heterojunction transistor. For example, the equivalent on-state resistance of the low voltage normally-on or normally-off device could decrease as the gate voltage is elevated (i.e. high currents in the first power heterojunction transistor). This decrease in the equivalent resistance through which the current flows in the current sensing transistor could compensate (partly) for example for the increase in the resistance of the resistors in the sensing load or the 2DEG of the low voltage transistor due to the temperature increase.

The monolithically integrated (internal) resistor or any of the resistors in the sensing load could be made of 2DEG or a metal layer used in the process. Alternatively, it could be made of one of the existing layers in the process such as the pGaN layer or bespoke resistor layers such as CrSi. If for example several metal layers are used to make ohmic or Schottky connections, to provide field plating or to transport the current, any of such metal layers could be used to make the resistor(s) in the sensing load to provide a voltage drop across it(them), which is proportional to the current that flows through the current sensing transistor and a therefore a scaled measure of the current that flows through the first power heterojunction transistor.

The resistor(s) in the sensing load described above could have a resistance dependent on the temperature. It is for example known that 2DEG and the metal layers have a higher resistance at higher temperatures and this behaviour is relatively well reproduced from one device to another. The resistors in the sensing load could therefore be used as a relative temperature sensor. The baseline resistance could be measured at a reference temperature. The variation in the resistance could be associated with a temperature variation. For example, the 2DEG resistance or the metal resistance of the internal resistor increases if the temperature is increased due to the self-heating during the operation of the first power heterojunction transistor or due to an increase in the ambient temperature. The voltage drop across this resistance will therefore not only depend on the current flowing through the current sensing structure (and proportionally to the current in first power heterojunction transistor) but also on the resistance variation with temperature. When the temperature is increased, due to for example the self-heating effect, the voltage across the resistor load (or sensing load) connected to the source terminal of the current sensing transistor increases. Thus, the voltage drop across this resistor load does not only vary with current but also with the temperature. The signal could be used to provide internal or external protection for both over-current and/or over-temperature conditions. In this way, an over-temperature protection as well as an over-current protection is provided through the action of one of the current sensing transistor described above and an internal resistor made of a 2DEG or a metal layer or an internal sensing load.

In this embodiment the protection function may be realised by reducing the resistance of the second heterojunction transistor (as part of the feedback circuit) which could be connected between source and the gate of the main power transistor. The voltage drop across the current sensing load increasing with current and temperature may directly, or by using other components in the integrated feedback circuit, increase the gate voltage of the second heterojunction transistor and hence reducing the resistance between the gate and source of the main power transistor.

In a second embodiment of the fourth aspect of this disclosure, a single current sensing transistor provides the double current sensing in the form of a single monolithically integrated current sensing transistor featuring an additional sensing pad connected to its source terminal to provide a voltage signal to an external circuit.

In this embodiment the current sensing transistor can provide double current sensing, both external and internal. The single current sensing transistor has its source terminal connected to an integrated resistor or sensing load. The voltage drop across this load is used, through an internal circuit which includes the second heterojunction transistor to provide a feedback to the gate, such that when an over-current is detected, the gate voltage can be adjusted as to limit or lower the current. The extra sensing pad connected to the source of the current sensing transistor could be connected to a controller/microprocessor unit that will perform current reading and/or current protection externally and provide through an external driver an appropriate control as to limit or adjust the amplitude, pulse width or switching frequency of the gate signal of the first power heterojunction transistor.

As with the previous case, in this embodiment, the internal sensing resistor or sensing could also be used to provide over-temperature protection based on the variation of the voltage drop across the resistive load or sensing load with the temperature. The feedback circuit could be used to provide either or both over-current or over-temperature protection by acting to limit or adjust (in amplitude or time, or the frequency or duty cycle) the signal applied to the gate driver as to optimise the system operation and protect the first power heterojunction transistor or the system where the heterojunction chip is part of. As in the previous case, the protection function may be realised by reducing the resistance of the second heterojunction transistor which is connected between the source and the gate of the main power transistor, as described in the previous aspects of the disclosure.

Alternatively, an external sensing load could be connected to the sensing pad for precision reading of the current first power heterojunction transistor. The voltage across this external sensing load or directly the current through the current sensor could feed into a controller/microprocessor unit that can further analyse it and instruct the gate driver to limit or adjust (in amplitude or time, or the frequency or duty cycle) the signal applied to the gate driver as to optimise the system operation and protect the first power heterojunction transistor or the system where the heterojunction chip is part of.

In a third embodiment of the fourth aspect of this disclosure, the current through the at least one current sensing transistor flows through a metal resistor through which, simultaneously, at least part of the current in the first power heterojunction transistor flows as well. This metal resistor could be part of the existing metallization which connects the internal source contacts of a multi-finger structure to the source pad (source terminal). Fingers are connected to a distributed metal track/bus which connects to the source pad. The fingers could be connected to the track/bus farther away from the source pad, in which case they will see a larger metallization resistance (as the current from them flows through a longer path of the source metallization track) compared to the fingers which are closer to the source pad. The at least one current sensing transistor could be farther away from the metal pad as to encounter a larger resistance of the metallization track and as to enlarge the voltage drop created across this resistance by the multiple and distributed currents through other fingers belonging to the first power heterojunction transistor.

The at least one current sensing transistor could feature a monolithically integrated sensing load as described above. One terminal of this sensing load could be connected to the source of the at least one current sensing transistor and the other terminal to the metal resistor associated with the metal track as described above. Alternatively, the metal resistor described above could comprise an additional 2DEG or a metal resistor or a sensing load (as described above) that is (are) in series with the resistor of the metal track. The source terminal of the at least one current sensing transistor could be connected to a sensing pad for external current sensing and/or protection and/or an internal feedback circuit to act on the gate as described above. By using this additional metal resistor which could comprise the metal resistance of the source track and through which at least part of the current of the first power heterojunction transistor flows, the sensitivity and the linearity of the voltage potential at the source terminal of the at least one current sensing transistor could be enhanced.

In another embodiment of the fourth aspect of this disclosure, the internal feedback circuit comprises a common source, a common drain or a common gate amplifier stage with the voltage drop across the sensing load, as an input. The circuit may further use a voltage divider. The voltage divider may consist of integrated devices such as Schottky diodes, resistors, capacitors, diodes, transistors with gate tied to source or drain or transistors with the gate controlled by a similar voltage divider. The output of the amplifier stage can be used for over-current or over-temperature protection by turning on the second heterojunction transistor with its drain attached to the gate terminal of the first power heterojunction transistor, as described in the first aspect of the disclosure. Alternatively, the output of the amplifier stage can be used as an external output or to feedback to components of the integrated circuit other than overcurrent protection. Examples of this arrangement are given further in this disclosure (see detailed description of figures section).

According to a further aspect of the present disclosure there is provided a method of manufacturing a III-nitride semiconductor based heterojunction power device, the method comprising:

forming a first III-nitride semiconductor region formed on a substrate, wherein the first III-nitride semiconductor region comprises a first heterojunction comprising at least one two dimensional carrier gas of second conductivity type;

forming a first terminal operatively connected to the first III-nitride semiconductor region;

forming a second terminal laterally spaced from the first terminal and operatively connected to the first III-nitride semiconductor region;

forming a first gate terminal formed over the first III-nitride semiconductor region between the first terminal and the second terminal;

forming a second III-nitride semiconductor region formed over the substrate, wherein the second III-nitride semiconductor region comprises a second heterojunction comprising at least one two dimensional carrier gas of the second conductivity type;

forming a third terminal operatively connected to the second III-nitride semiconductor region;

forming a fourth terminal laterally spaced from the third terminal in a first dimension and operatively connected to the second III-nitride semiconductor region, wherein the fourth terminal is connected to the first gate terminal;

forming a second gate terminal formed over the second III-nitride semiconductor region between the third terminal and the fourth terminal;

forming a second gate terminal contacting the second gate region, a third heterojunction transistor formed on a substrate, the third heterojunction transistor comprising:

forming a third III-nitride semiconductor region formed over the substrate, wherein the third III-nitride semiconductor region forming a fifth terminal operatively connected to the third III-nitride semiconductor region;

forming a sixth terminal laterally spaced from the fifth terminal in a first dimension and operatively connected to the third III-nitride semiconductor region, wherein the sixth terminal is operatively connected to the second terminal; and forming a third gate region, formed over the third III-nitride semiconductor region between the fifth terminal and the sixth terminal;

forming a third gate terminal contacting the third gate region, wherein the third gate terminal is operatively connected to the first gate terminal, and wherein the third heterojunction transistor is used in current sensing of the first power heterojunction transistor and the second heterojunction transistor is configured to be used in sensing and/or protection functions of the first power heterojunction transistor The first plurality of highly doped semiconductor regions (in the first transistor) and the second plurality of highly doped regions (in the second transistor) may be manufactured in the same process step. The difference between continuous highly doped semiconductor regions and discontinuous highly doped semiconductor regions may be realized by a layout change of the same mask.

Finally, in summary of the discussions above, the disclosure is described as follows:

The disclosure relates to a semiconductor device in GaN technology with an integrated sensing and protection circuit where the main power transistor which uses a gate structure based on a continuous p-GaN layer and transistors used for sensing are made using the same gate technology featuring continuous or discontinuous p-GaN layers. The drain terminal of at least one of the sensing transistors (the second heterojunction transistor) may be connected to the gate terminal of the main power transistor. At least one current sensing transistor, with an identical structure but with scaled down area (or gate with) of the main power switch is monolithically integrated with the first power transistor (the main power transistor). The at least one current sensing could be connected to a sensing resistor or a sensing load and could provide internal or external current sensing. A feedback circuit may be monolithically integrated to provide internal protection. Different implementations of feedback and protection circuits are described to mitigate gate the events of drain over-current or over temperature and over-current or gate over-voltage. This helps with a rugged operation and increased safe operating area. In one of the main embodiments, a normally-on, depletion mode transistor which contains a gate structure based on discontinuous p-GaN layer containing islands within stripes or closed shapes around the cells senses a specific own gate voltage or/and drain current of the main power transistor and acts to lower or limit the gate voltage on the main power transistor when a condition of over gate voltage or over drain current is detected in the main power transistor. The specific on-state gate voltage (mentioned above) is equal to the voltage at which a two dimensional electron gas (2DEG) is formed under the p-GaN islands and results in a steep decrease in the on-state resistance of the normally on, depletion mode transistor.

In other embodiments of this disclosure, there is provided a heterojunction chip comprising a main power transistor, at least one current sensing transistor, a sensing load and a feedback circuit where the at least one current sensing transistor provides double current sensing, one for internal use by the current feedback circuit for self-protection against over-currents or over-temperatures and one for external use for optimising the drive/control of the first power heterojunction transistor or for additional protection against over-currents or over-temperature. The protection may done by reducing the resistance of the second heterojunction transistor between the gate and the source of the main power transistor. An external micro-processor could analyse and process the external current sensing signal and instruct an external/internal gate driver to limit or adjust (in amplitude or time, or pulse width, or the frequency or duty cycle) the signal applied to the gate driver as to optimise the system operation and protect the first power heterojunction transistor or the system where the heterojunction chip is part of. The sensing load could be made of internal or external resistors made of 2DEG or other materials or layers and/or low voltage transistors. It could also contain a resistive contribution from the source metallization tracks through which at least a portion of the current in the main power device flows.

The internal feedback circuit may comprise common source, common drain or common gate amplifier stages with the voltage drop across the sensing load, as an input. The circuit may further use voltage dividers, Schottky diodes, resistors, capacitors, diodes, transistors. The output of the amplifier stage can be used for over-current or over-temperature protection by turning on the second heterojunction transistor with the drain attached to the gate of the main power device.

BRIEF DESCRIPTION OF THE DRAWINGS

The present disclosure will be understood more fully from the accompanying drawings, which however, should not be taken to limit the disclosure to the specific embodiments shown, but are for explanation and understanding only.

DETAILED DESCRIPTION OF PREFERRED EMBODIMENTS

The present disclosure will be understood more fully from the accompanying drawings, which however, should not be taken to limit the disclosure to the specific embodiments shown, but are for explanation and understanding only.

Figure 3:
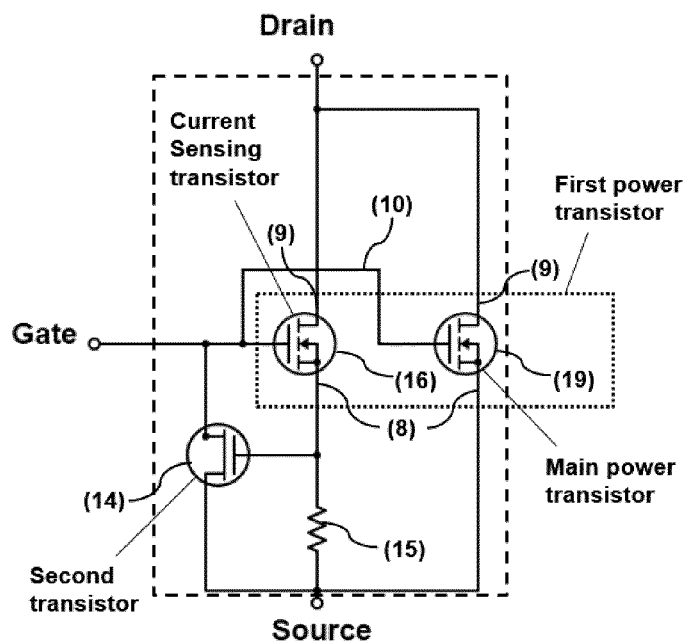
FIG. 3 shows a schematic circuit diagram of an over-current protection circuit according to one embodiment of the disclosure, wherein the over-current protection is composed of a resistor and an actively switched low voltage depletion mode transistor (second transistor) controlling the potential on the gate terminal of the first power transistor.

FIG. 3 shows a schematic circuit diagram of an over-current protection circuit according to one embodiment of the present disclosure, where the proposed disclosure is composed of a resistor and an actively switched low voltage depletion mode transistor (second transistor) controlling the potential on the gate terminal of the main power transistor. The over-current protection circuit includes a first power transistor 19 composed of a current sensing transistor 16 and a main power transistor 19, a depletion mode transistor (second transistor) 14, and a current sensing resistor 15.

In this embodiment the current sensing transistor 16 has an identical structure to the main power device 19, but is scaled to a known, much smaller area when compared to the main power device 19 (by a factor X where X is much larger than 1). The depletion mode transistor (second transistor) 14 is monolithically integrated with the first power transistor. The current sensing transistor 16 has the drain and the gate terminals connected to the gate and drain terminals of the main power transistor 19 respectively. The source of the current sensing transistor 16 is connected to one terminal of a resistor 15, or a resistive load (that could be formed of a normally-on transistor). The resistor 15 or resistive load could be monolithically integrated with the first power device 16, 19 and the second transistor 14 (by for example using a 2DEG layer). Alternatively, the resistor 15 or resistive load could be external. The second terminal of the resistor 15 could be connected to the source of the main power device 19 (as shown in FIG. 3a) or could be connected to the ground. Alternatively, the second terminal of the resistor 15 could be connected to an independent pad in order to measure externally the current through the current sensing device 16 and thus determine the current in the main power device 19. The role of the resistor/resistive load 15 is to translate the current from the current sensing transistor 16 into a voltage drop across it. The first terminal of the resistor 15 could be connected to the gate terminal of the second heterojunction transistor which could be a normally-on (depletion mode) device 14 (as shown in FIG. 3a and described above) or alternatively to a normally-off device using discontinuous or continuous p-GaN gate technology respectively. The circuit acts to lower or limit the gate voltage on the first power transistor 16, 19 when a condition of over drain current is detected in the current sensing transistor 16, by using the depletion mode device 14 and the resistor 15 or resistive element described above. If a condition of over-current is detected the voltage drop across current sensing resistor 15 increases and thus the voltage bias on the gate terminal of transistor 14 increases causing a sharp decrease in resistance of transistor 14. This provides a reduction in the resistance of the path between the gate and source of the first power device 16, 19 thus limiting the potential on the first gate terminal. The circuit described can act as protection from a drain over-current event.

Figure 4:
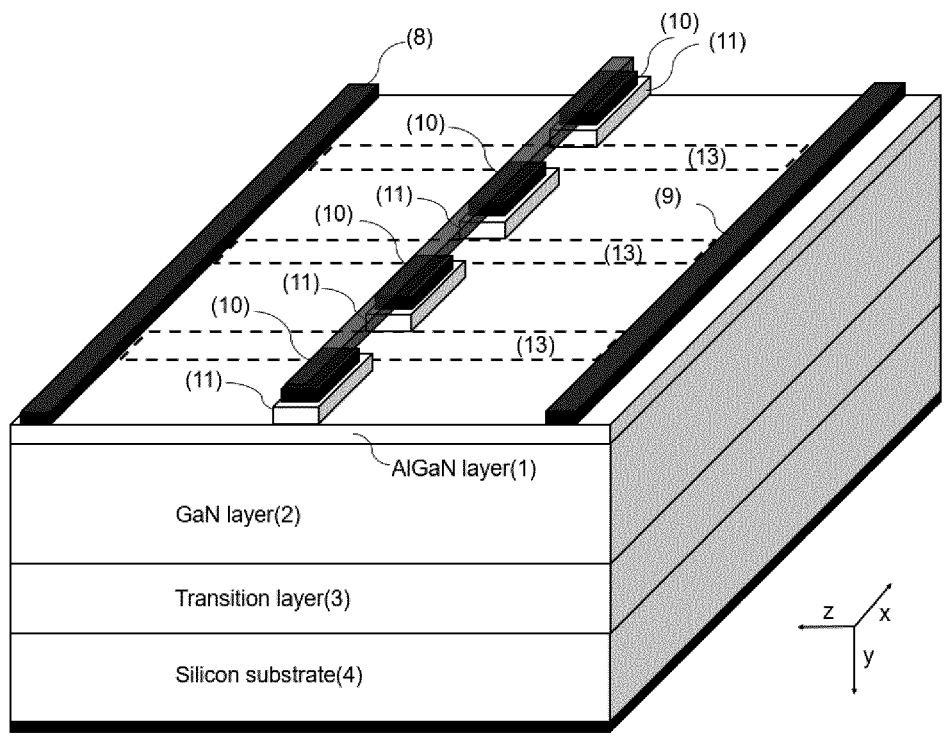
FIG. 4 shows a schematic perspective view of a depletion mode transistor that can be used in an embodiment device according to the present disclosure.

FIG. 4 shows a schematic perspective view of a depletion mode device used in the proposed protection circuits.

The depletion mode transistor also includes a high voltage drain terminal 9 arranged in physical contact with the AlGaN layer 1. The high voltage drain 9 terminal forms an Ohmic contact to the 2DEG. A low voltage source terminal 8 is also arranged in physical contact with the AlGaN layer 1 and also forms an Ohmic contact to the 2DEG. The drain 9 and source 8 terminals consist of Ohmic metal contacts on the surface of AlGaN layer 1 or directly in contact with a good electrical connection to the 2DEG.

Regions of highly p-doped III-V semiconductor 11 are formed in contact with the AlGaN semiconductor layer 1. These have the function of reducing the 2DEG carrier concentration under the highly doped regions 11 when the device is unbiased, and are formed of p-GaN material in this embodiment. The p-GaN regions 11 are discrete regions and are spaced from each other in the 2nd dimension (the x-direction). The p-GaN regions 11, also known as p-GaN islands, extend in the x-direction in a discontinuous line. The discontinuous layer of a p-type GaN gate is made of islands placed within stripes or closed shapes. The highly p-doped GaN regions 11 may be Magnesium (Mg) doped. The highly p-doped GaN regions 11 extend along an axis which is perpendicular to the axis connecting the source terminal 8 and the drain terminals 9, where the current flows.

The highly doped layer 11 in the discontinuous gate structure of the depletion mode device may be manufactured in the same process step as a highly doped layer of the main power transistor. All p-GaN layers (continuous or discontinuous) can be done in the same process step. The difference between continuous and discontinuous layers is realized by a layout change of the same mask.

A gate control terminal 10 is configured over the highly doped regions 11 in order to control the carrier density of the 2DEG at the interface of the semiconductor layers 1, 2. All the p-GaN islands 11 of the depletion mode device are connected to the same gate electrode 10. The gate terminal 10 consists of metal contacts placed on the intermittent regions of the p-GaN islands 11. The electrical connection between the high voltage terminal (drain) 9 and the low voltage terminal (source) 8 is determined by a voltage signal applied on the third terminal (gate) 10. The gate control terminal 10 can be either an Ohmic contact or a Schottky contact.

Figure 1:
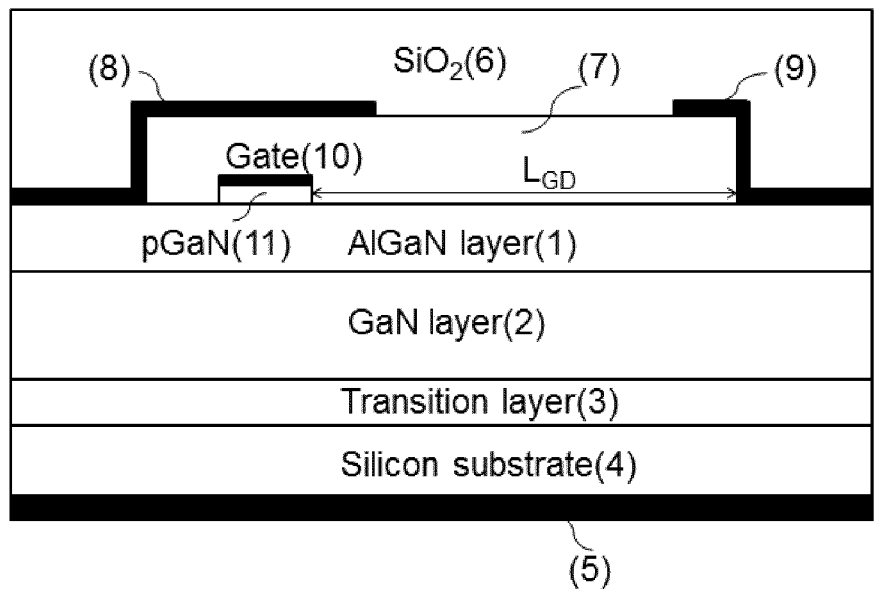
FIG. 1 shows a schematic cross section of the active area of a state-of-the-art p-GaN HEMT.
Figure 2:
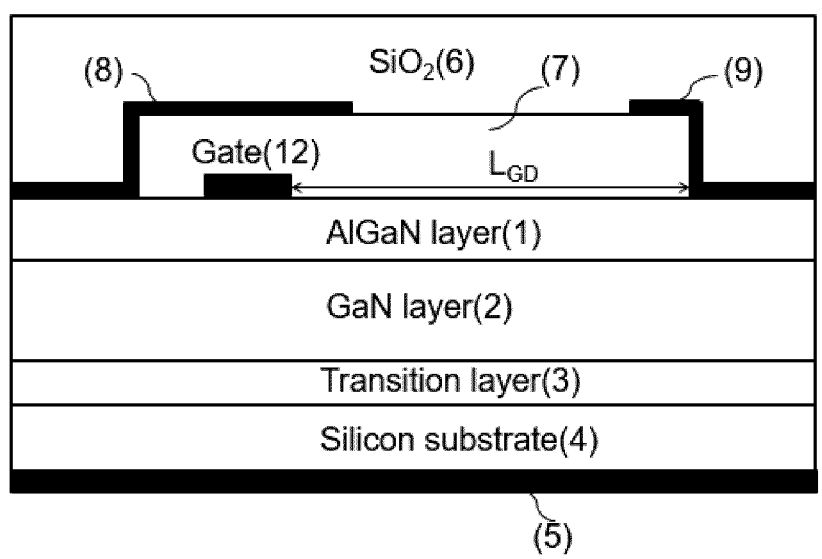
FIG. 2 shows a schematic cross section of the active area of a state-of-the-art depletion mode HEMT with a Schottky gate terminal.

The depletion mode device as described in the embodiments may be the depletion mode AlGaN/GaN HEMT shown in FIG. 4. There are advantages of the proposed structure compared to using the state-of-the-art Schottky gate depletion mode AlGaN/GaN HEMT, such as that shown in FIG. 2.

The proposed depletion mode device enables the control of the device threshold voltage through adjustments in the layout design of the transistor rather than adjustments in epitaxial growth or the gate metal stack. Layout re-design leads to an optimized device at a much lower cost/effort than the other methods currently available.

The depletion mode device used as a component may be a normally-on depletion mode device where an increased positive gate bias voltage can be applied (>7V) before the main on-state conduction channel changes from drain-source to gate-source. Currently in state-of-the-art devices the voltage at which gate turn-on occurs is typically between 0.7-2V. At higher positive gate terminal bias, the proposed depletion mode device can achieve an increased carrier density in the channel beneath the gate terminals reducing the overall on-state resistance of the device.

This gate structure of the depletion mode device allows the fabrication of a depletion mode device in a fabrication process which could not be used to form a depletion mode device with a Schottky contact directly on the top AlGaN layer. In state-of-the-art device, the gate of the depletion mode device would have to be manufactured using additional process steps.

The use of such the depletion mode device can therefore enable increased integration of protection electronics with the main power switch. The monolithic integration of the electronics described above allows a reduction in the overall system size and costs as well as lower BOM (bill of material) and increased reliability. It can also lead to improved performance through the reduction of parasitic components associated with the interconnections between discrete devices.

Figure 5:
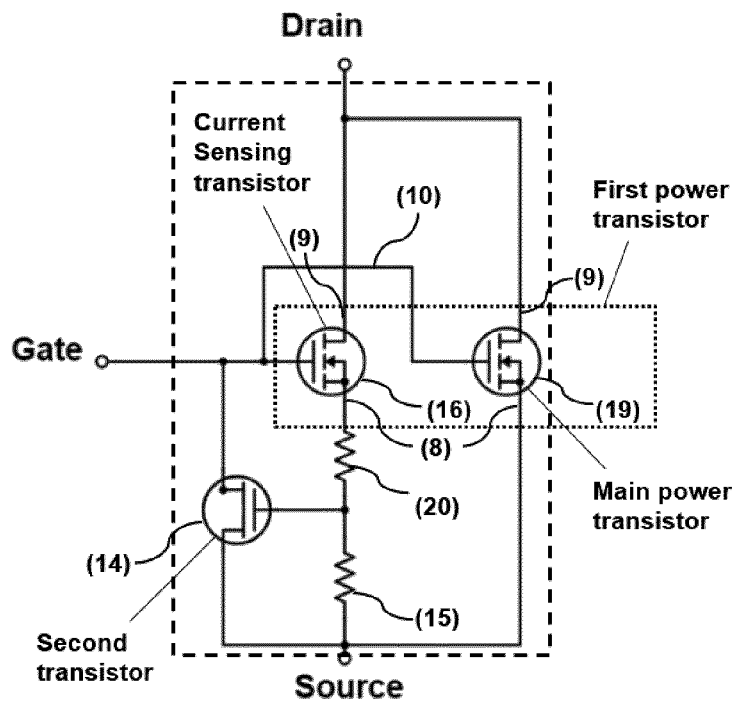
FIG. 5 shows a schematic circuit diagram of a further embodiment of the proposed disclosure, in which the device further includes a resistor or resistive load.

FIG. 5 shows a schematic circuit diagram of a further embodiment of the proposed disclosure. This is similar to the embodiment shown in FIG. 3 and provides similar functionality; however in this embodiment the circuit includes a further resistor 20.

The second resistor 20 is added in series with the current sensing transistor 16. The second resistor forms a potential divider with the first resistor 15. The choice of resistances for the two resistors 15, 20 allows an easy adjustment of the maximum current level possible between the drain and source terminals of the main power transistor 19 in this arrangement.

Figure 6:
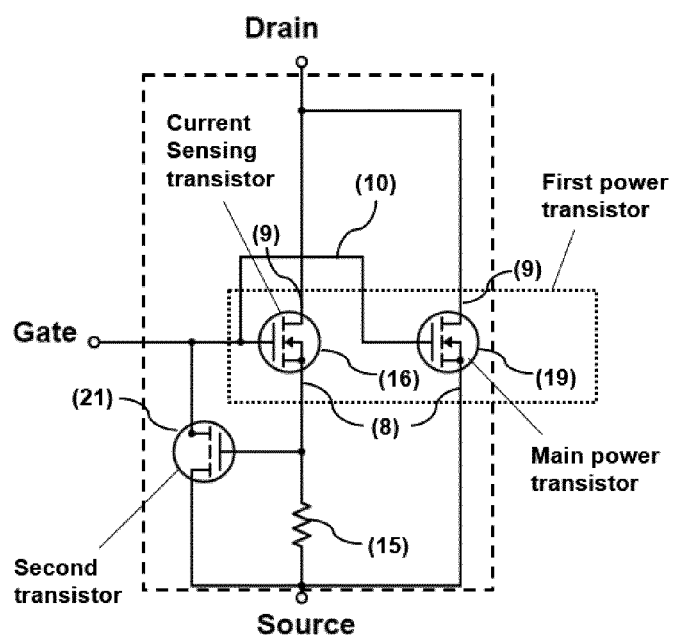
FIG. 6 shows a schematic circuit diagram of further embodiment of the proposed disclosure in which an over-current protection circuit is implemented which is composed of a resistor and an actively switched low voltage enhancement mode transistor (second transistor) controlling the potential on the gate terminal of the first power transistor.

FIG. 6 shows a schematic circuit diagram of a further embodiment of the proposed disclosure where an over-current protection circuit is implemented which is composed of a resistor 15 and an actively switched low voltage enhancement mode transistor (second transistor) 21 controlling the potential on the gate terminal of the first power transistor 16, 19. This is similar to the embodiment shown in FIG. 3 and provides similar functionality; however the enhancement mode transistor 21 replaces the depletion mode transistor of previous embodiments.

The heterojunction power device may include an over-current protection circuit as described above where the low voltage depletion mode transistor is replaced with a low voltage enhancement mode transistor 21. Similarly to previous embodiments, the potential at the gate terminal of the enhancement mode transistor 21 is increased as the current through the current sensing resistor 15 is increased. As current through the high resistance transistor 16 increases, the potential drop across the current sensing resistor 15 increases. This raises the potential on the gate of the low voltage enhancement mode transistor 21 and thus adjusts its resistance. A critical current through the high resistance transistor 16 can turn on the low voltage enhancement mode transistor 21 limiting the potential on the gate of the first power transistor 16, 19. The circuit described can act as protection from a drain over-current event.

Figure 7:
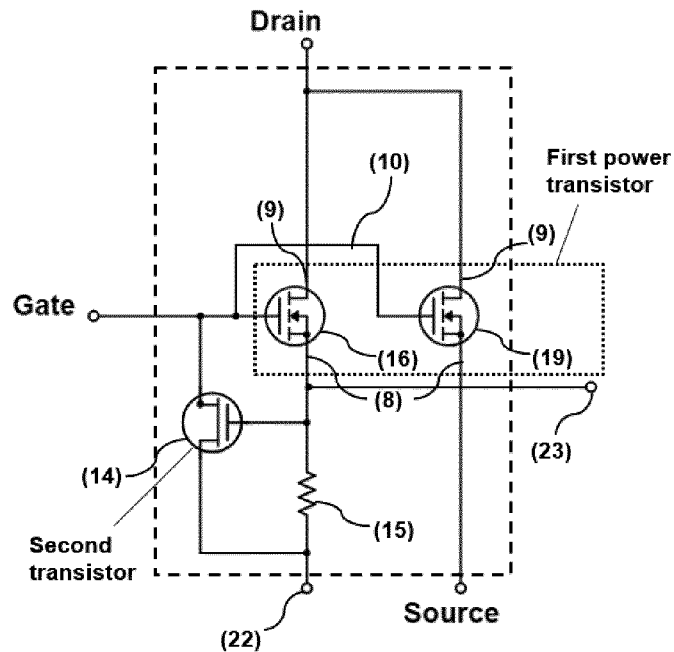
FIG. 7 shows a schematic circuit diagram of a further embodiment of the proposed disclosure in which an over-current protection circuit is implemented, and in which additional external terminals are provided.

FIG. 7 shows a schematic circuit diagram of a further embodiment of the proposed disclosure where an over-current protection circuit is implemented, in which additional external terminals are provided. This is similar to the embodiment shown in FIG. 3 and provides similar functionality; however in this embodiment external terminal 22 and external terminal 23 are included.

In this embodiment the second terminal of the resistor 15 is used as an external terminal 22 instead of being connected to the source of the main power transistor 19. Additionally, a further external terminal 23 is added to measure the current through the current sensing transistor 16.

Figure 8:
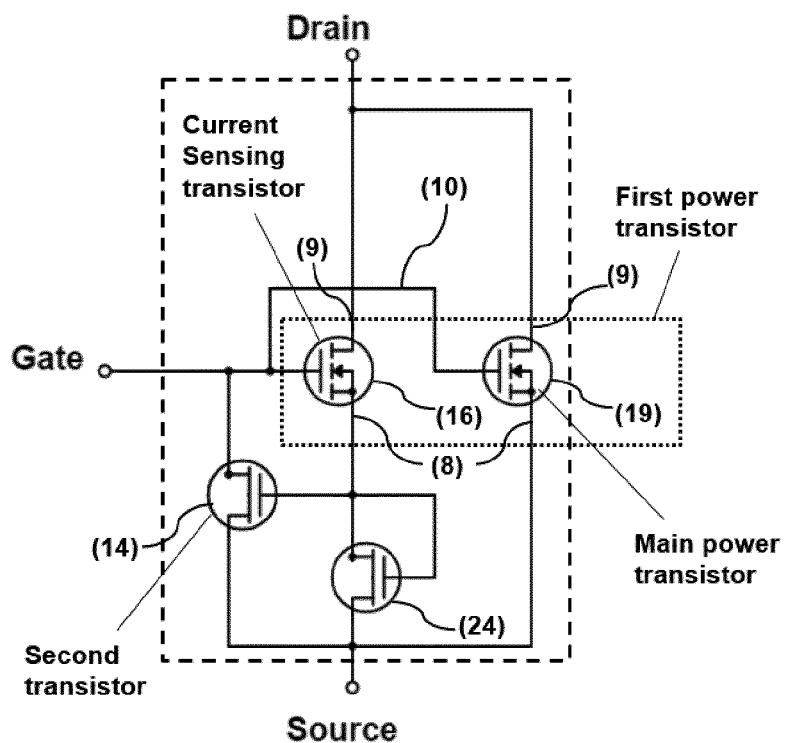
FIG. 8 shows a schematic circuit diagram of a further embodiment of the proposed disclosure in which an over-current protection circuit is implemented, and in which the current sensing resistor is replaced by an appropriately scaled normally-on transistor.

FIG. 8 shows a schematic circuit diagram of a further embodiment of the proposed disclosure in which an over-current protection circuit is implemented, and in which the current sensing resistor is replaced by an appropriately scaled normally-on transistor 24 with the drain terminal of the normally-on transistor 24 connected to the gate terminal of normally-on transistor 24. This is similar to the embodiment shown in FIG. 3 and provides a similar functionality. The normally-on transistor 24 in this configuration will act as a resistive element. The source terminal of transistor 24 may be connected to the source terminal of the main power transistor 19 or may be an external terminal.

Figure 9:
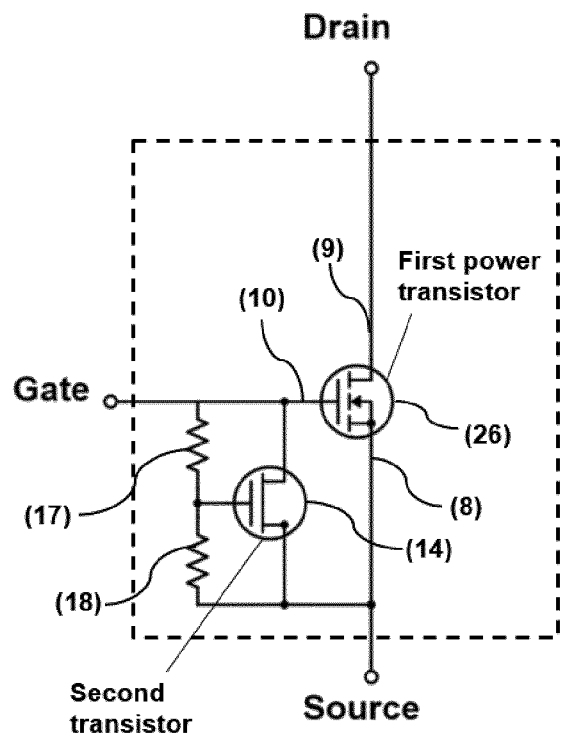
FIG. 9 shows a schematic circuit diagram of a voltage limiting circuit where the voltage limiting circuit is composed of two resistors forming a potential divider and an actively switched low voltage depletion mode transistor (second transistor) controlling the potential on the gate terminal of the first power transistor.

FIG. 9 shows a schematic circuit diagram of a voltage limiting circuit where a voltage limiting circuit is composed of two resistors in series 17, 18 forming a potential divider and an actively switched low voltage depletion mode transistor (second transistor) 14 controlling the potential on the gate terminal of the first power transistor. In this figure the current sensing transistor is not explicitly shown but the power transistor device which incorporates the current sensing transistor is shown as a single transistor 26.

In this embodiment of the disclosure, the normally-on transistor 14 is used to lower or limit the gate voltage on the first power transistor 26 when a condition of over gate voltage is detected in the first power transistor 26. The depletion mode transistor 14 may be a normally-on transistor or could alternatively be a normally-off transistor. The gate voltage detection is done by using the potential divider 17, 18 attached to the gate of the first power device 26 with the mid-point connected to the gate of the depletion mode transistor 14. The potential divider 17, 18 can be integrated with the main power transistor 26 and the depletion mode transistor 14 (for example by using 2DEG layers). Alternatively, the potential divider may include resistors or resistive loads (for example normally-on transistors) that are external to the transistor 14, 26.

Figure 10:
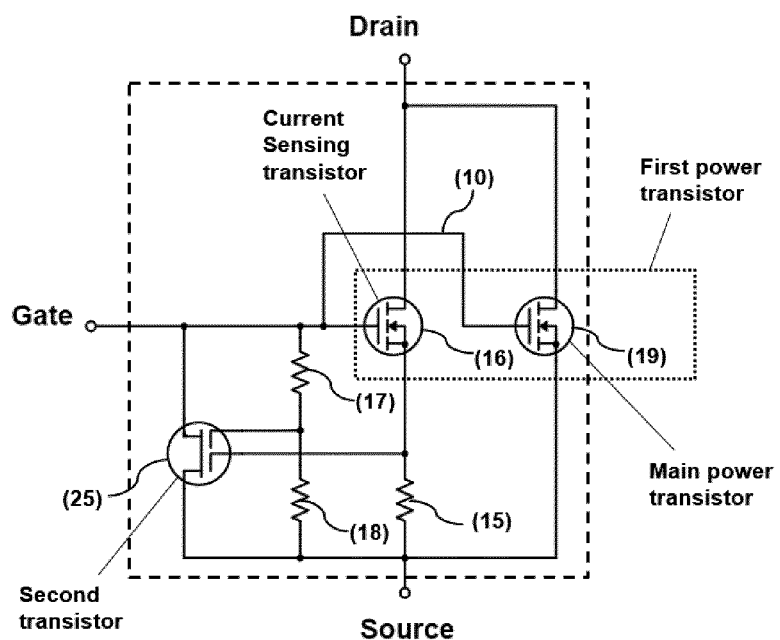
FIG. 10 shows a schematic circuit diagram in which the over-current protection circuit shown in FIG. 3 and the over-voltage protection circuit shown in FIG. 9, are combined into a single integrated (or discreet) circuit with the same functionality.

FIG. 10 shows a schematic circuit diagram of a proposed embodiment of the disclosure where the over-current protection circuit shown in FIG. 3 and the over-voltage protection circuit shown in FIG. 9 are be combined into a single integrated (or discrete) circuit with the same functionality. In this embodiment the depletion mode transistor of the previous embodiments, is a double gate terminal normally-on transistor (second transistor) 25.

In this embodiment, a normally-on transistor 25 with a double gate is used, with the first gate connected to the mid-point of the potential divider 17, 18 described above and the second gate connected to the resistor/resistive load 15 attached to the current sensing transistor 16. In this case if one condition or the other occurs (over-current detection or over gate voltage-detection), then the normally-on transistor 25 has a steep increase in the current pulling the gate potential lower until one of the conditions (over-current detection or over gate voltage-detection) is no longer detected. This results in limiting the gate voltage of the first power transistor 16, 19 to a desired level for increased safe operating area and robustness.

Figure 11:
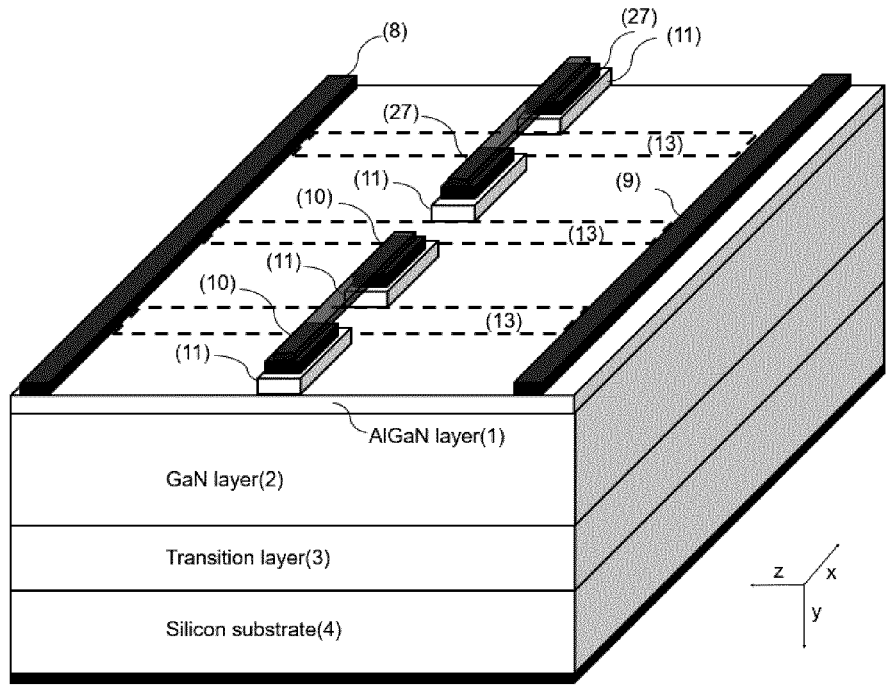
FIG. 11 shows a schematic perspective view of a double gate terminal normally-on transistor that can be used in the circuit shown in FIG. 10.

FIG. 11 shows a schematic perspective view of the double gate terminal normally-on transistor used in the circuit schematic shown in FIG. 10. In this embodiment there are two pluralities of highly doped regions 11. The first gate contact 10 is connected to the first plurality of highly doped regions and the second gate contact 27 is connected to the second plurality of highly doped regions.

Figure 12:
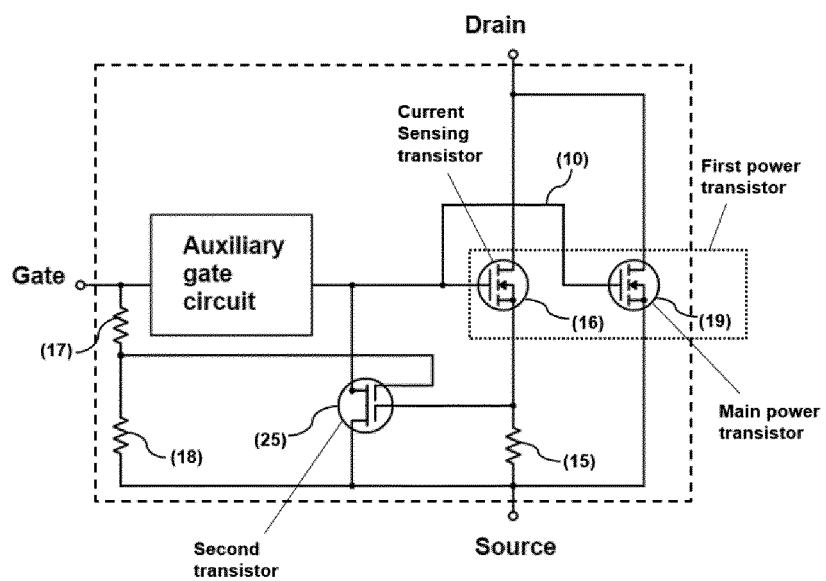
FIG. 12 shows an alternative schematic circuit diagram of the combined protection circuit according to an embodiment of the disclosure.

FIG. 12 shows an alternative schematic circuit diagram of the combined protection circuit according to an embodiment of the disclosure. In this embodiment, the combined protection circuit can be used in an integrated (or discrete) circuit with an auxiliary gate circuit such as the one described in the PCT application 'WO2019012293A1: A power semiconductor device with an auxiliary gate structure', and which is incorporated herein by reference in its entirety.

Figure 13:
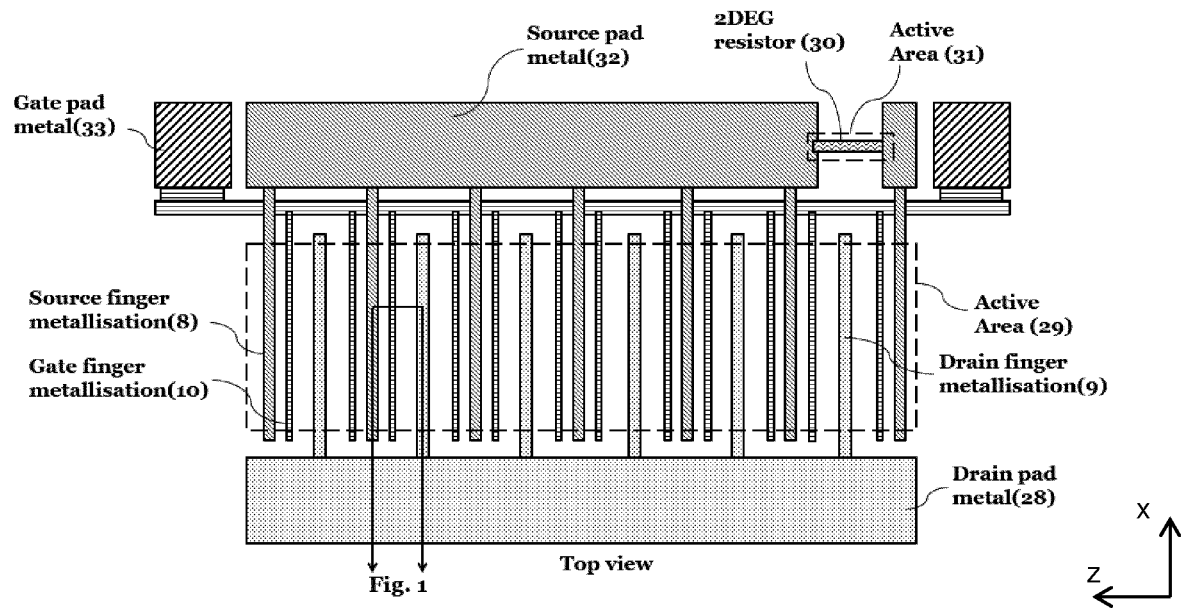
FIG. 13 shows a schematic top view of the layout design for the monolithic integration of the current sensing transistor, the main power transistor, and the sensing resistor.

FIG. 13 shows a schematic top view of a layout design for the monolithic integration of the current sensing transistor 16, the main power transistor 19, and the sensing resistor 15. In this embodiment the current sensing transistor 16 and main power transistor 19 share the same active area 29, the same drain pad 28 and the same gate pad 33 but not the same source metallisation/pad. The sensing resistor 15 (2DEG resistor 30) is formed in active area 31, isolated from the active area of current sensing transistor 16 and main power transistor 19 and is connected in series with the two source terminals of transistors 16,19.

Figure 14:
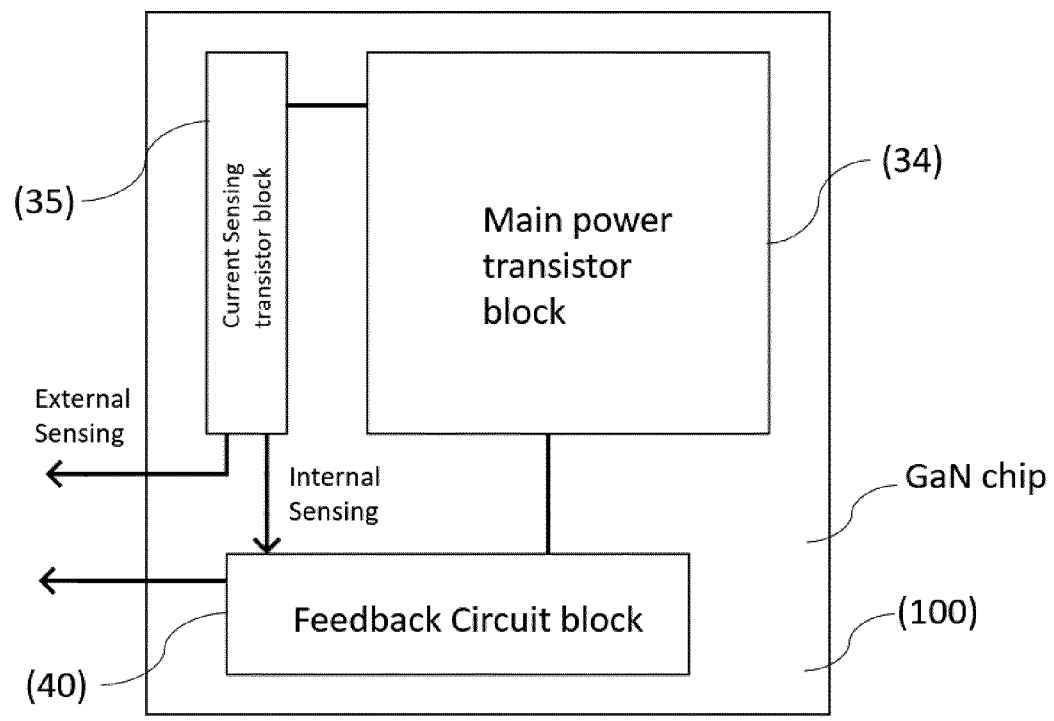
FIG. 14 illustrates a block diagram of an additional embodiment of the proposed disclosure, showing a Heterojunction chip incorporating a main power transistor block, a current sensing block and a feedback circuit to provide both internal and external sensing signals.

FIG. 14 illustrates a block diagram of an additional embodiment of the disclosure. In this embodiment the main power transistor block (the first power heterojunction transistor) 34, the current sensing transistor block 35 and a feedback circuit block 40 are monolithically integrated on a heterojunction (GaN) chip 100. In operation, an internal sensing signal from the current sensing transistor block 35 may be applied to the feedback circuit block 40 where the signal may be modified in a suitable form or for example inverted and/or amplified. The output of the feedback circuit 40 can be supplied to the main power transistor 34 in order to lower or limit its gate voltage amplitude or pulse width of the switching frequency when a certain current limit is reached in the main power transistor. Additionally, the current sensing circuit may provide an external sensing signal to an external controller/micro-processor (that is not monolithically integrated but may be co-packaged) as to optimize the drive/control of the main power transistor and/or to additionally protect the main power transistor by providing through the driver circuit a control of the gate signal. Additionally (or as an alternative), a feedback signal to an external controller/microprocessor may be provided by the feedback block 40.

Figure 15A:
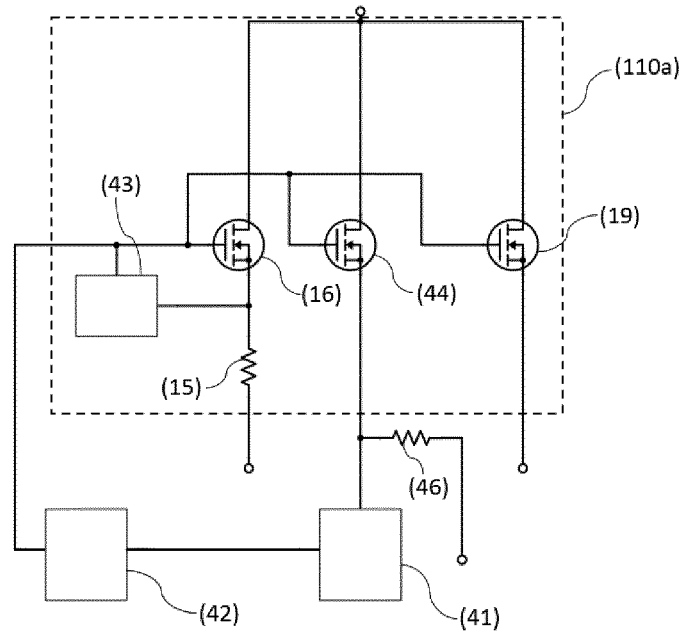
FIGS. 15a and 15b show a schematic circuit diagram of the Heterojunction chip featuring one main power transistor, two current sensing transistors, a feedback circuit, at least one sensing resistor, and a representation of a controller unit and a gate driver unit.

FIG. 15A illustrates schematically an additional embodiment of the disclosure. This is one example of a circuit with the functionality of the embodiment described in FIG. 14.

This embodiment includes a main power transistor 19 and two current sensing transistors 16, 44 monolithically integrated on a Heterojunction chip 110a. The transistors 16 and 44 could be one or more finger structures, placed alongside the main power transistor, 19 made of multiple fingers. The transistors 16, 44 and 19 share the same drain terminal and they are driven by the same gate signal but have distinctive source terminals. The first current sensing transistor 16 is connected to an integrated resistor 15. The internal sensing signal at the source of transistor 16 is applied to a monolithically integrated feedback circuit 43. The feedback circuit 43 could include the second heterojunction transistor (not shown). The output of the internal feedback circuit is applied to the gate terminal of the main power transistor 19 and may operate as the feedback circuit block 40 described in FIG. 14. An external sensing signal is provided at the source of transistor 44. In this example, the external sensing signal is the voltage drop across an external precision resistance 46. This signal is fed in the controller/microprocessor unit 41 that can further analyse it and instruct the gate driver 42 to limit or adjust (in amplitude or time, or the frequency or duty cycle) the signal applied to the gate driver as to optimise the system operation and protect the main power transistor or the system where the Heterojunction chip 110a is part of. The controller/microprocessor unit 41, the gate driver 42 and the precision resistance 46 could be co-packaged or provided on a common printed board. Alternatively, the gate driver 42 could be monolithically integrated within the Heterojunction chip 110a (not shown). Another alternative is to combine 42 and 43 in a single unit and monolithically integrated it in the Heterojunction chip 110a (not shown)

Figure 15B:
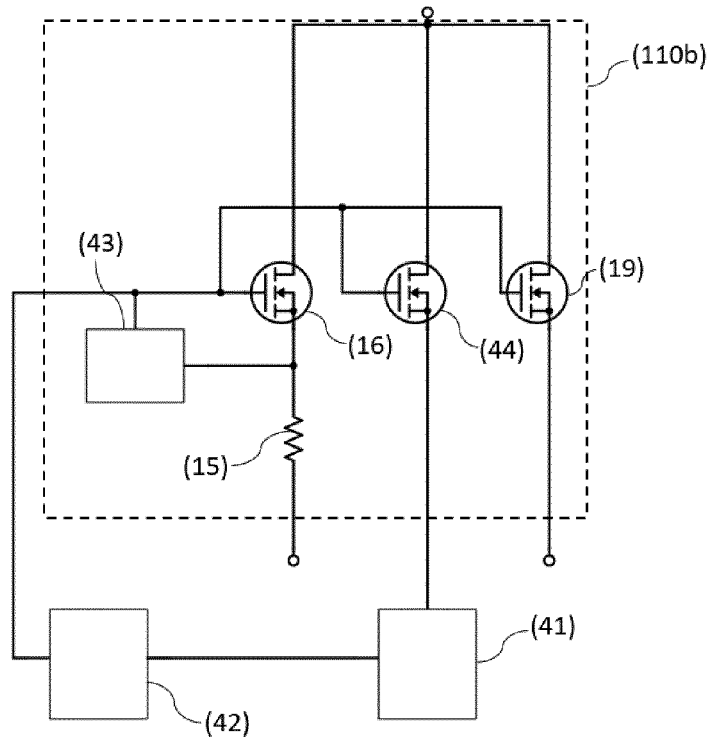

FIG. 15B illustrates schematically an additional embodiment similar in operation to the example shown in FIG. 15A. In this embodiment the current through sense transistor 44 is fed directly into the controller/microprocessor unit 41.

Figure 16:
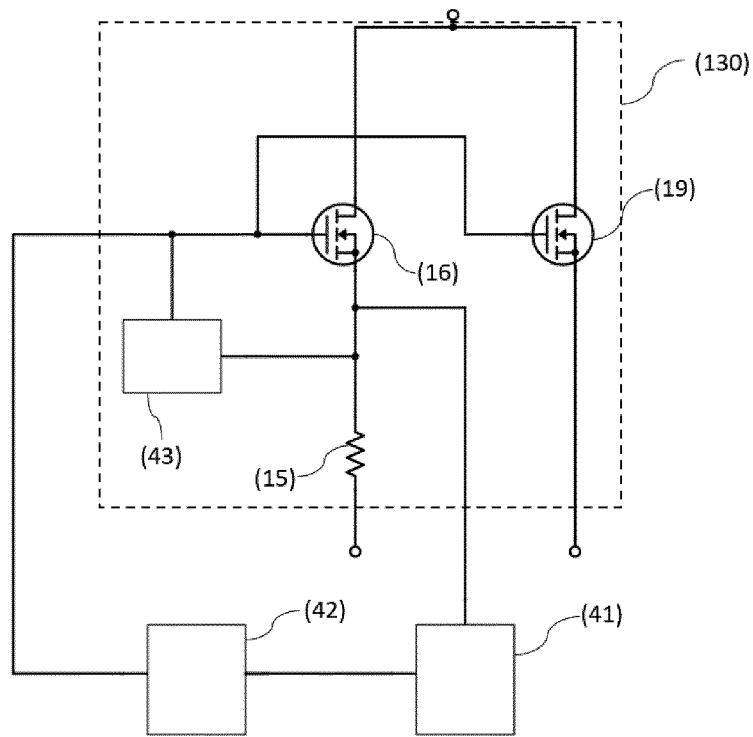
FIG. 16 shows a schematic circuit diagram of the Heterojunction chip featuring one main power transistor, one current sensing transistors which aims to provide both internal and external current sensing, one sensing resistor, a feedback circuit and a representation of a controller unit and a gate driver unit.

FIG. 16 illustrates schematically an additional embodiment of the proposed disclosure similar to the embodiment shown in FIG. 15b. In the example shown in this embodiment, a single current sensing transistor 16 is used to provide both the internal and external sensing signal which is provided at the source terminal of the current sensing transistor. This embodiment again includes integrated resistor 15, integrated feedback circuit 43, controller/microprocessor unit 41 and a gate driver 42. In this embodiment, for example, the controller/microprocessor unit 41 can detect accurately the voltage drop across the resistor 15, which is proportional to the current flowing through the current sensing transistor 16, which at its turn is proportional (or largely proportional) to the current flowing in the main transistor 19. This signal is further processed to instruct the gate driver 42 to limit or adjust (in amplitude or time, or the frequency or duty cycle) the signal applied to the gate driver as to optimise the system operation and/or protect the first power heterojunction transistor or the system where the Heterojunction chip 110a is part of.

Figure 17:
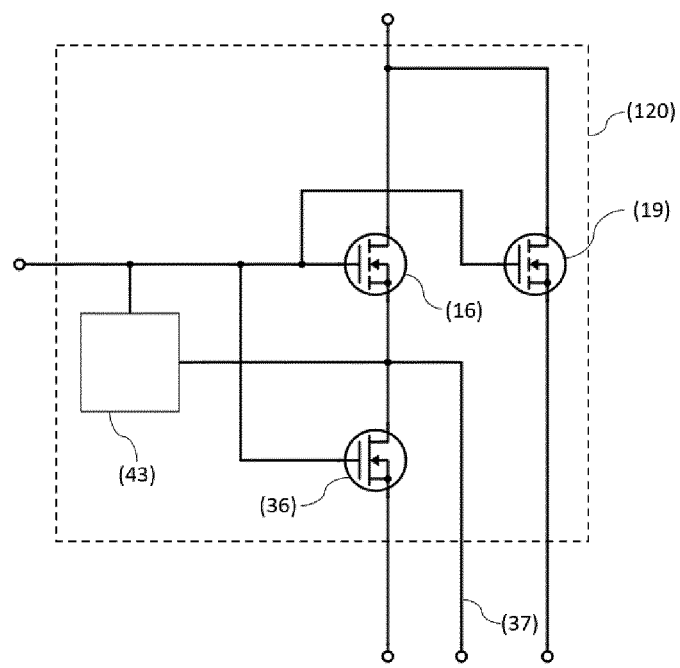
FIG. 17 shows a schematic circuit diagram of the Heterojunction chip featuring one main power transistor, one current sensing transistors, which aims to provide both internal and external current sensing, one low voltage depletion mode transistor as part of a sensing load, a feedback circuit and a representation of a controller unit and a gate driver unit.

FIG. 17 illustrates schematically an additional embodiment of the disclosure. In this embodiment a transistor 36 is used as a sensing load rather than resistor 15 as in previous similar embodiments. In this example, transistor 36 is a low voltage depletion mode transistor. This transistor could have a similar structure to that of the transistor shown in FIG. 4. The gate terminal of transistor 36 is connected to the gate terminal of the main power transistor 19. This arrangement could provide some compensation for the loss of linearity of the current signal of the current sensing transistor 16 as a function of the current of the main transistor 19. This loss in linearity could be due to the temperature increase caused by the self-heating effect in the main transistor 19. In this example, the equivalent on-state resistance of the low voltage normally-on device 36 could decrease as the gate voltage is elevated (i.e. high currents in the first power heterojunction transistor). This decrease in the equivalent resistance through which the current flows in the transistor 16, could compensate (partly) for example for the increase in the resistance of the 2DEG of the transistor 16 due to the temperature increase. The current sensing signal could again be used internally (connection to feedback circuit 43) or externally (terminal 37).

In other examples not shown here a combination of series and/or parallel resistors in the sensing load connected together with a low voltage normally-on or normally-off device could be used. The combinations of such transistors with low-voltage normally on or normally off transistors could provide an improved equivalent sensing load in order to increase the accuracy of current sensing.

Figure 18A:
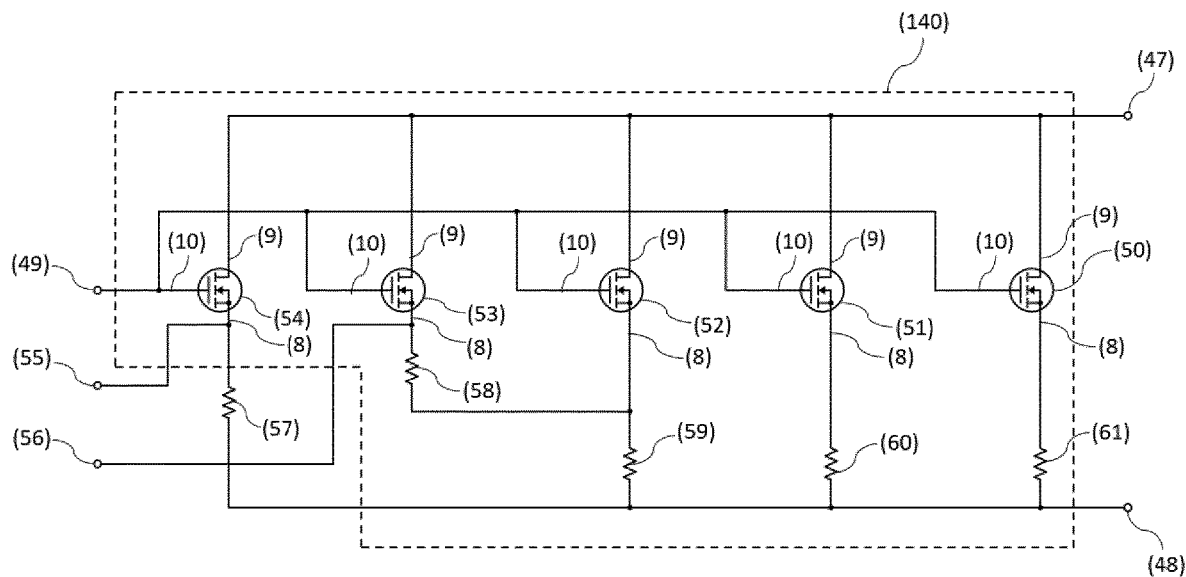
FIG. 18a shows a schematic circuit diagram of the Heterojunction chip featuring several fingers of a main power transistor, two current sensing transistors, and a metallization resistor used both for carrying current from parts of the main transistor as well as part of a sensing load.
Figure 18B:
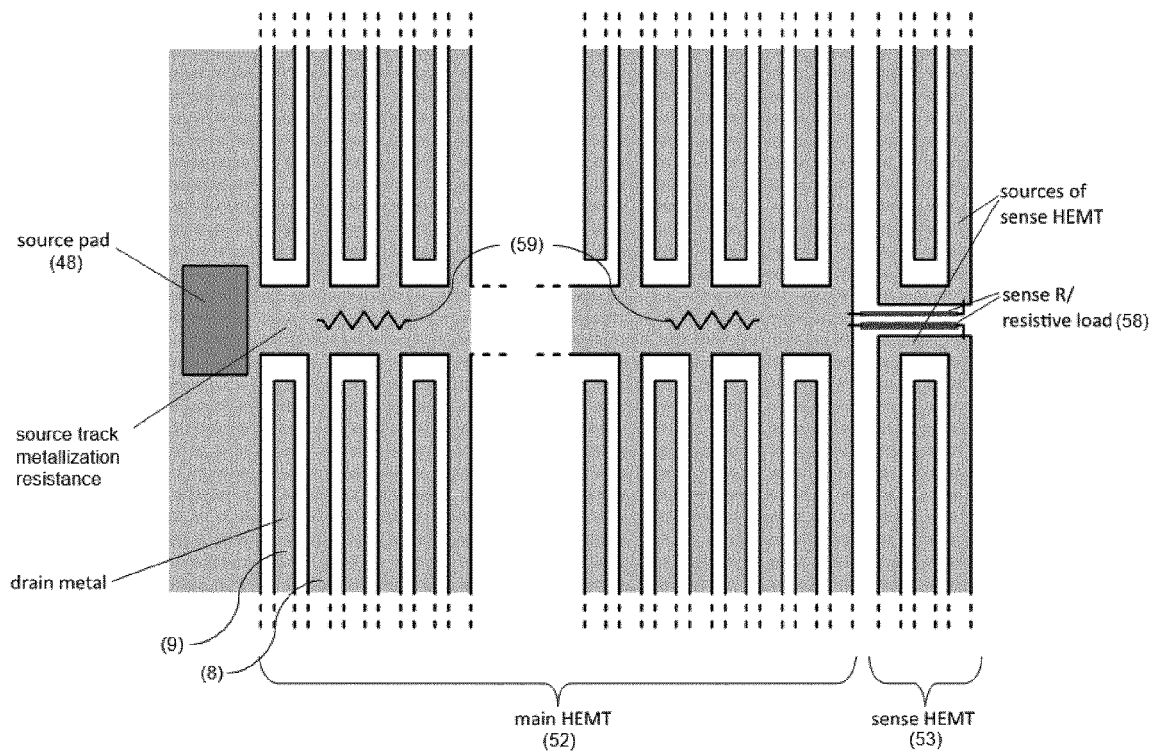
FIG. 18b shows a schematic top view of an example of a layout design of the Heterojunction chip described in FIG. 18a, FIGS. 19 to 25 show different possible schematic implementations of the internal feedback circuit block shown in FIGS. 14 to 17.

FIG. 18A illustrates schematically an additional embodiment of the proposed disclosure. In this embodiment the equivalent circuit of the main power transistor 19 is drawn as a number of transistors in parallel (50, 51, 52) representing the different fingers in a device with an interdigitated layout based on a multi-finger structure as shown in FIG. 18B. The resistors (59, 60, 61) represent the track metallization resistance in series with each finger of the device. The resistor 58 is similar to the integrated resistor 15 described in previous embodiments and resistor 57 is similar to the external resistor 46 described in previous embodiments. The drain terminal 47, source terminal 48 and gate terminal 49 are also labelled in FIG. 18. This embodiment can again provide different current sensing signals 55, 56 which can be used either internally or externally. In this embodiment the current through sense HEMT 58 flows through a metal resistor 59 through which, simultaneously, at least part of the current of the first power heterojunction transistor flows as well (current through transistor 52). This metal resistor 59 could be part of the existing metallization which connects the individual source contact regions of a multi-finger structure to the source pad (source terminal 48). Fingers are connected to a distributed metal track/bus which connects to the source pad as shown in FIG. 18B. The current sense fingers of transistor 53 could be connected to the track/bus farther away from the source pad, in which case they will see a larger metallization resistance (as the current from them flows through a longer path of the source metallization track) compared to the fingers which are closer to the source pad. By using this additional metal resistor 59 which could comprise the metal resistance of the source track (as described above) and through which at least part of the current of the first power heterojunction transistor flows, the sensitivity and the linearity of the voltage potential at the source terminal of the sensing transistor 53 could improve.

Figure 19A:
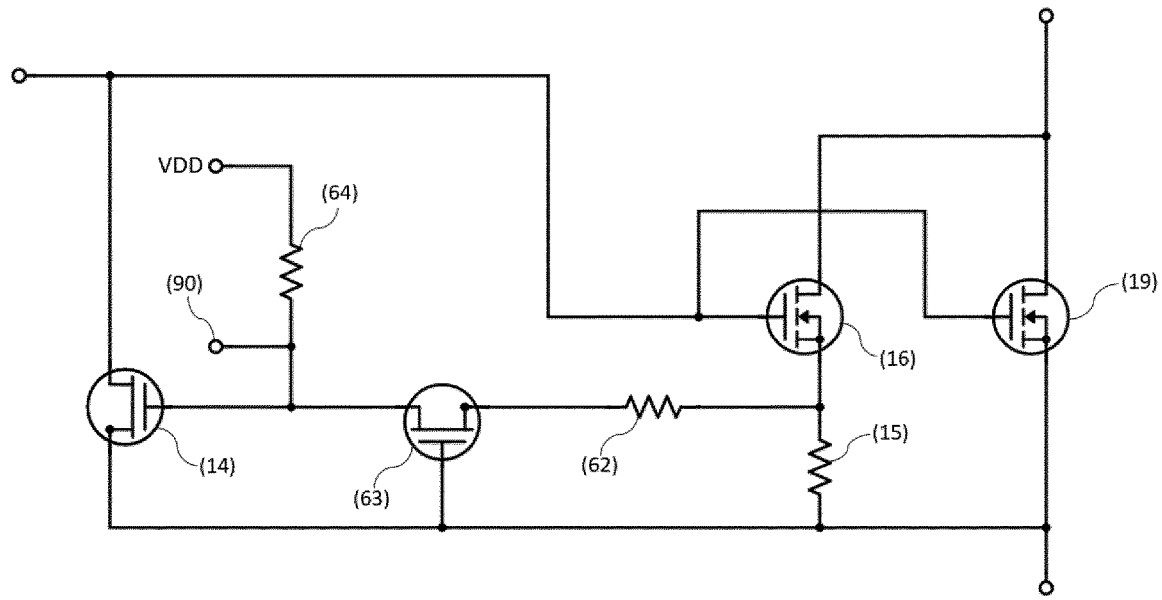
Figure 19B:
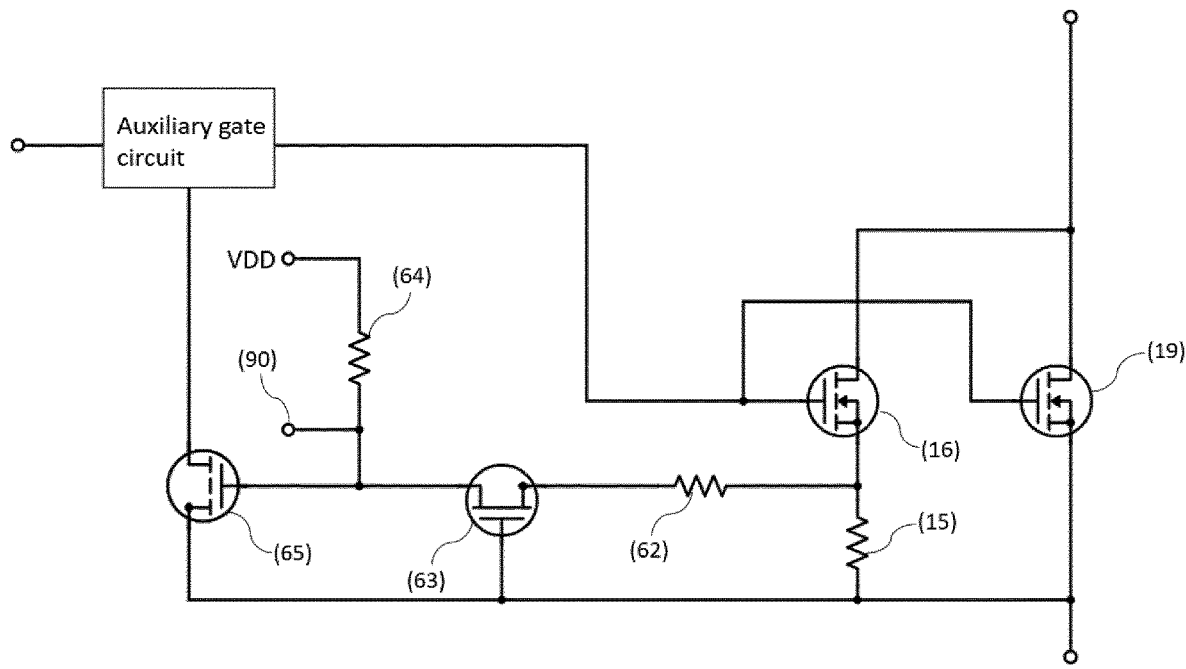
Figure 19C:
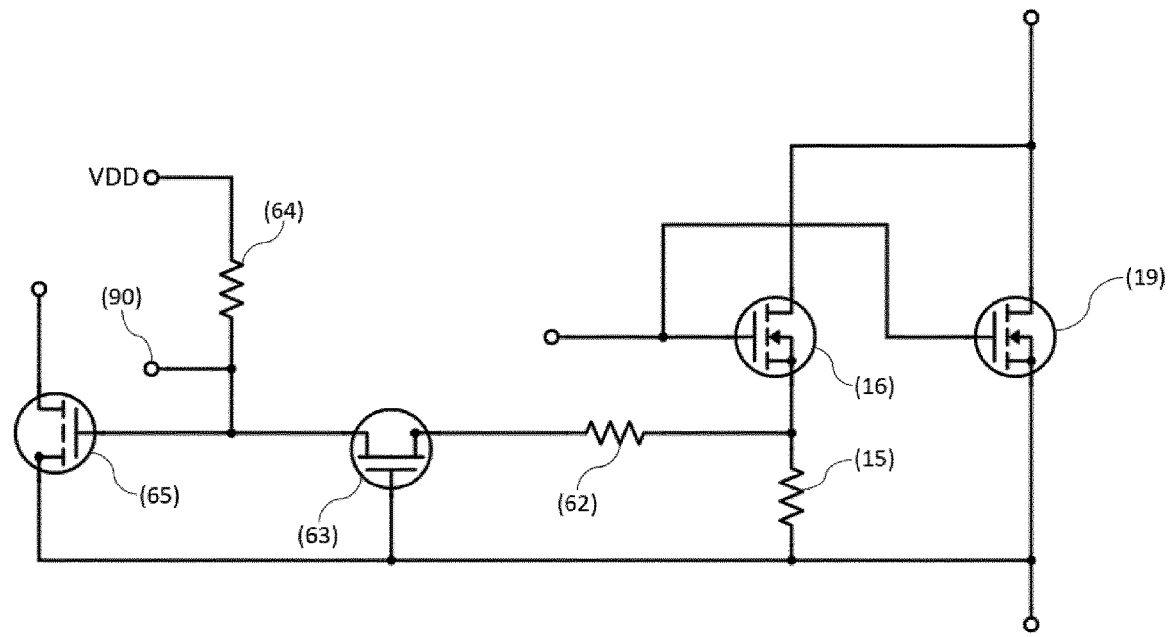

FIGS. 19a, 19b and 19c illustrate an additional embodiment of the proposed disclosure. In this embodiment one potential implementation of the internal feedback circuit 43 is given. The output of the current sense signal at the source of the sensing transistor 16 may be amplified by a depletion mode (normally-on) D-HEMT 63 (or enhancement mode E-HEMT in a different example) in a common gate configuration with a low-voltage supply voltage VDD. The circuit also includes additional integrated resistors 62, 64. The output signal of the common gate amplifier illustrated may be supplied to the second heterojunction transistor 14 illustrated in previous embodiments of the proposed disclosure as shown in FIG. 19a or another transistor 65 (FIGS. 19b and 19c), but having similar function to the transistor 14. The drain terminal of the second transistor 14 may be connected to the gate terminal of the main power transistor as shown in FIG. 19a. As illustrated in FIG. 19b the drain terminal of transistor 65 may be connected to an integrated auxiliary gate circuit. The auxiliary gate circuit may contain an auxiliary transistor (not shown) which has one of its terminals connected to the gate of the first power transistor. The gate of this auxiliary transistor could be connected to the drain terminal of the transistor 65. Alternatively the drain of the transistor 65 shown in FIG. 19c could be connected to an external circuit (not shown). Capacitors may be added, for example in parallel to resistor 15 or between the supply voltage VDD and the source of the current sensing HEMT 16, to improve the dynamic behaviour of the circuit.

In different embodiments, additional resistors 62, 64 as well as resistor 15 may be replaced by other integrated devices such as current sources using HEMTs, diodes, HEMTs with gate tied to source or HEMTs with the gate controlled by a voltage divider. Depending on the specific embodiment a linear amplification of the current signal or a non-linear overcurrent signal may be achieved for control or protection applications. The output of the amplifier circuit (terminal 90) may be used internally or externally for control purposes.

Figure 20:
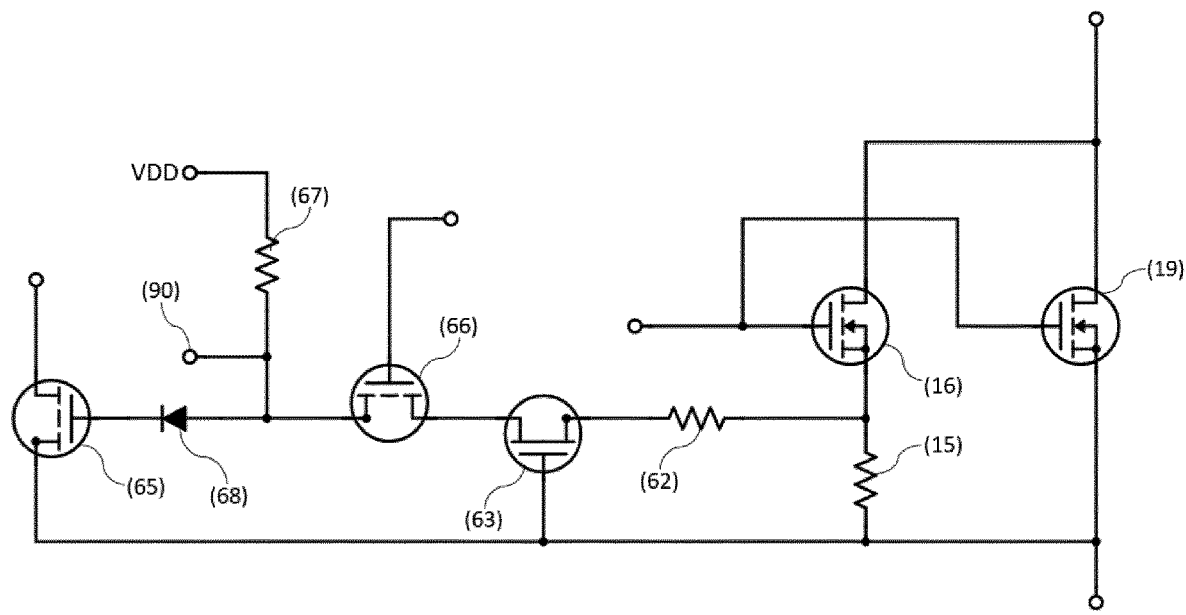

FIG. 20 illustrates an additional embodiment of the proposed disclosure. In this further embodiment an additional transistor 66 is added in series with the amplifying transistor 63. This may result in improved linearity, gain input or output impedance of the amplifier. Alternatively, this may increase the desired non-linearity in an overcurrent protection circuit and may maintain the over-current signal and protect the device after the current in the sense HEMT 16 has collapsed due to the overcurrent protection circuit. This latter function is achieved for example by a common gate amplifier HEMT 63 coupled with an E-HEMT 66 with the gate tied to a positive bias. In this case, the increasing current sense signal will increase the resistance in the common gate HEMT 63. Therefore, both the drain and source of the additional HEMT 66 are reaching a higher potential when the amplifying transistor 63 is less conductive, therefore the gate-to-source voltage of HEMT 66 is reduced and avoids an immediate pull-down of the overcurrent signal after the collapse of the HEMT current.

Figure 21:
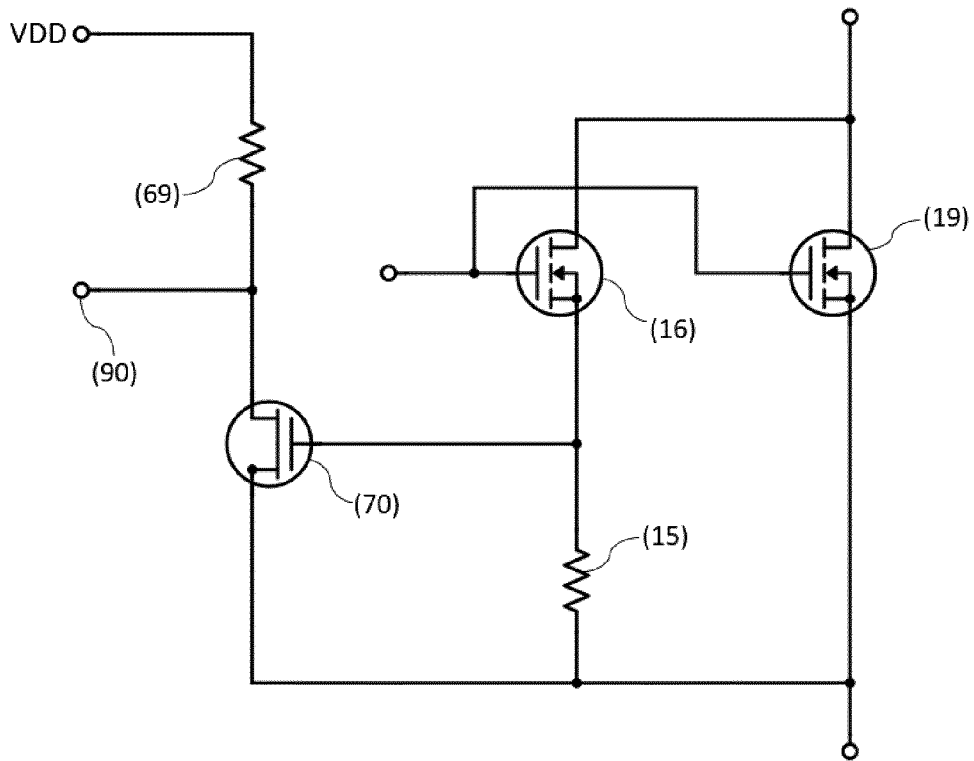

FIG. 21 illustrates an additional embodiment with a different potential implementation of the internal feedback circuit 43. In this embodiment, the feedback circuit contains an amplifier which includes a HEMT 70 in common source arrangement. The amplifying HEMT may be a D-HEMT and the resistive loads 15 and 69 may be designed in such a way that the output of the amplifier generates a signal that is increasing as the reverse current from source to drain increases in the main power HEMT 19. Detecting a reverse current may be used to control the main gate 10 to reduce conduction losses.

Figure 22:
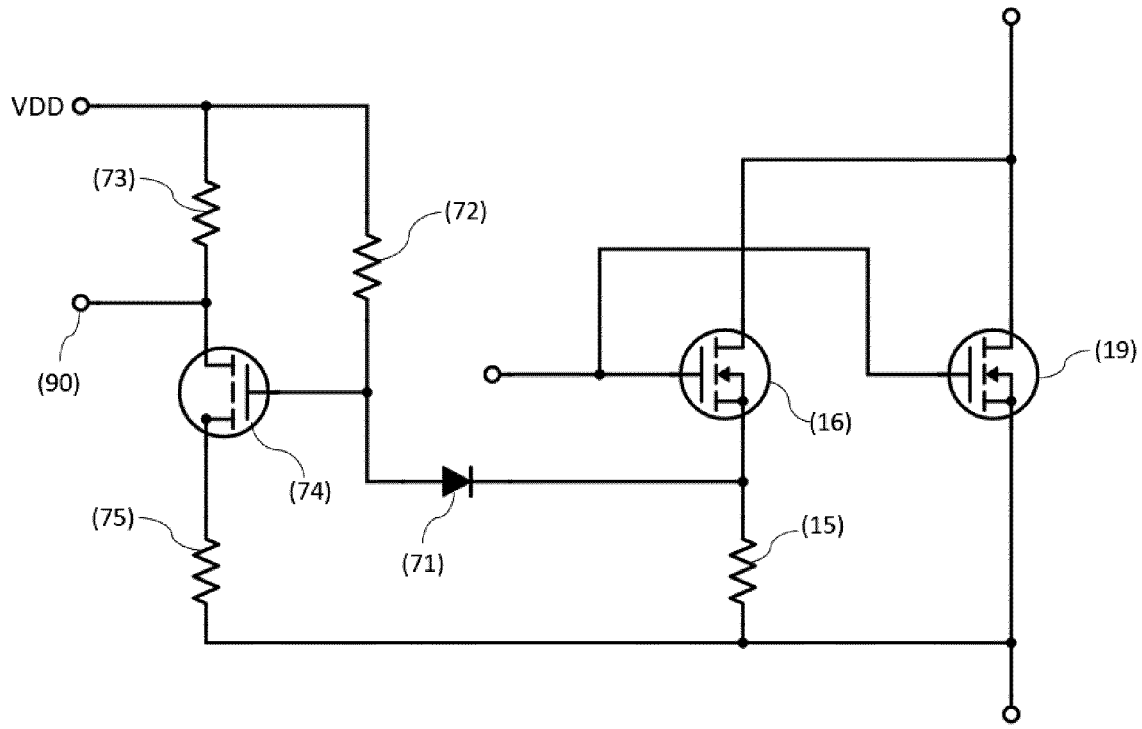

FIG. 22 illustrates an additional embodiment with a different potential implementation of the internal feedback circuit 43. The amplifying HEMT 74 may be a HEMT in common source arrangement where the output voltage from the source of the current sense HEMT 16 is shifted towards the supply voltage. The voltage shift may be achieved by integrated elements such as the diode 71 shown herein. Alternatively, resistors or HEMTs with a gate controlled by a voltage divider could be used. The voltage shift achieves that the input of the common source amplifier circuit is at an optimised level to achieve different design objectives, for example maximum linearity or maximum gain. The output of the amplifier circuit (terminal 90) may be used internally or externally for control purposes.

Figure 23:
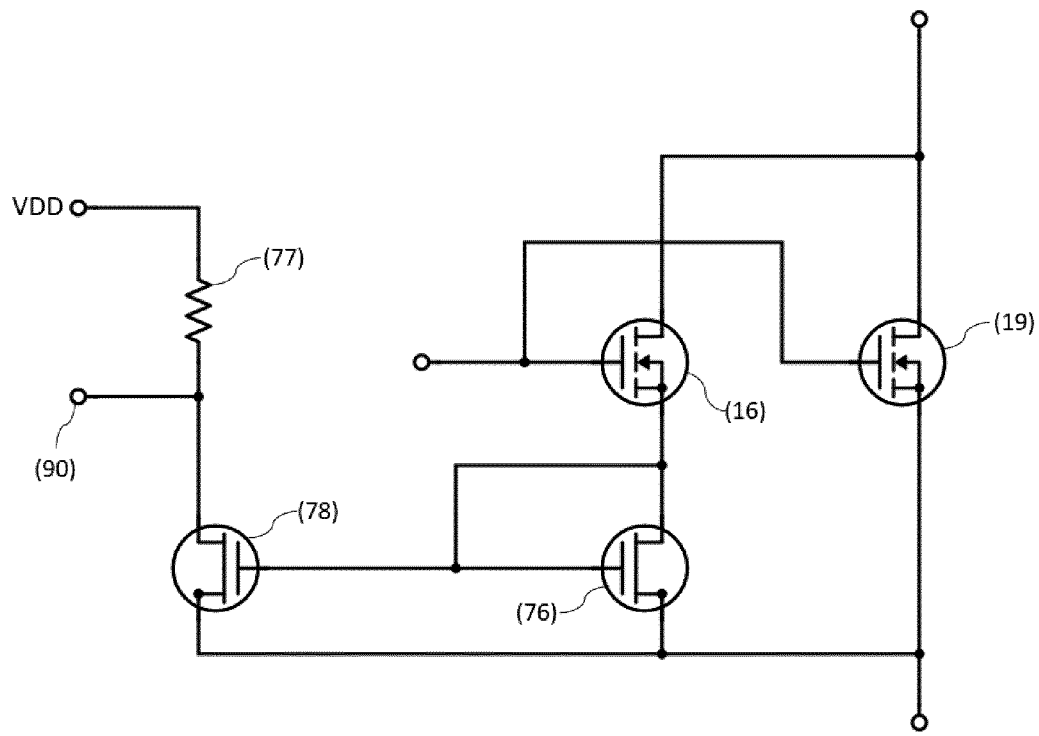

FIG. 23 illustrates an additional embodiment of the proposed disclosure. This embodiment shows another example of an amplifying HEMT 78 in a common source arrangement. This arrangement is commonly known as a current mirror. In this example, the current sensing load is a HEMT 76 with its gate terminal connected its drain terminal. Connecting the resulting output voltage as the input of a common source amplifier forms a current mirror circuit.

Figure 24:
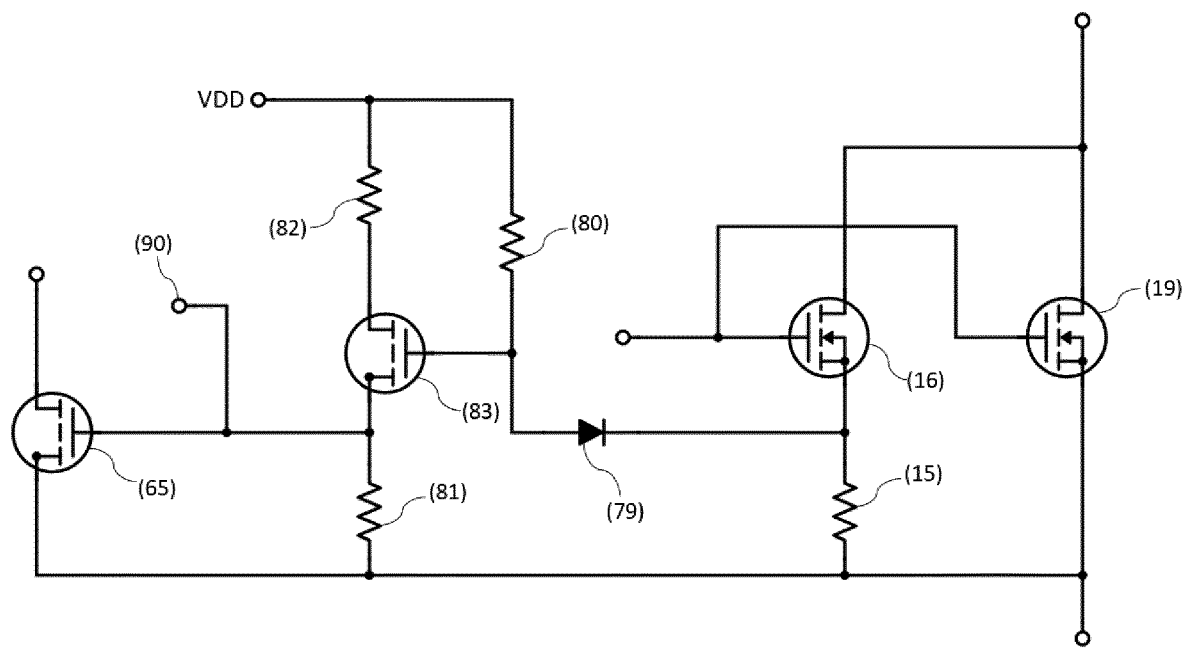

FIG. 24 illustrates an additional embodiment where the amplifying circuit may be a common drain circuit. Similar to the common source amplifying circuit described in FIG. 22, the output of the current sense HEMT 16 may be shifted towards the supply voltage to improve amplification. The output of the amplifier circuit (terminal 90) may be connected to the second heterojunction transistor (65/14) or may be used internally or externally for control purposes.

Figure 25:
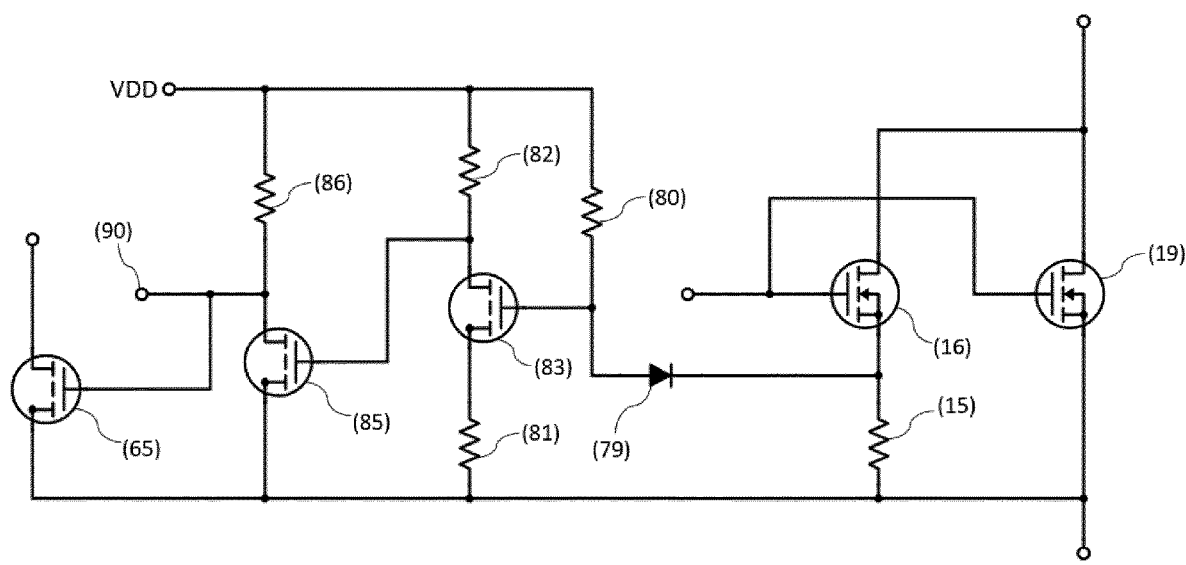

FIG. 25 illustrates an additional example where the amplifying circuit may consist of more than one amplification stage. Different embodiments can be proposed which include multiple amplification stages of the same type (e.g. two common source stages) or different types (e.g. a common source stage followed by a common drain stage). The output of the amplifier circuit (terminal 90) may be connected to the second heterojunction transistor (65/14) or may be used internally or externally for control purposes.

Furthermore, more than one amplification/feedback circuits may be connected to the same current sensing HEMT. This may be used to generate an optimised linear signal for current measurement and an optimised non-linear signal for current protection. The output of both types of amplification/feedback circuits may be connected to the gate of the second heterojunction transistor to act on the gate voltage of the main power transistor. In another example one amplifier circuit may be optimised for reverse currents and one for forward currents.

LIST OF REFERENCE NUMERALS

1 AlGaN layer
2 GaN layer
3 Transition layer
4 Silicon substrate
5 Substrate terminal
6 SiO$_2$ passivation
7 Surface passivation dielectric
8 Source terminal/metallization
9 Drain terminal/metallization
10 Gate terminal/metallization
11 Highly doped pGaN cap
12 Schottky gate terminal
13 Uninterrupted conduction channel at zero gate-source bias
14 Depletion mode transistor
15 Current sensing resistor
16 High resistance transistor
17, 18 Potential divider resistors
19 Low resistance transistor
20 Resistor
21 Low voltage enhancement mode transistor
22, 23 External terminals
24 Additional normally-on transistor
25 Double gate depletion mode transistor
26 Main power transistor
27 Additional gate of double gate transistor
28 Drain pad metal
29 Transistor active area
30 2DEG resistor
31 2DEG resistor active area
32 Source pad metal
33 Gate pad metal
34 Main power transistor block
35 Current sensing transistor block
36 Depletion mode transistor as sensing load
37 External sensing terminal
40 Feedback circuit block
41 Controller/Microprocessor unit
42 Gate driver
43 Feedback circuit
44 Current sensing transistor
46 Sensing resistor
47 Drain terminal/pad
48 Source terminal/pad
49 Gate terminal/pad
50, 51, 52 Main power transistor
53, 54 Current sensing transistor
55, 56 Sensing terminal
57, 58 Sensing transistor
59, 60, 61 Source track metallization resistance
62, 64, 67, 69, 72, 73, 75, 77, 80, 81, 82, 86 Resistor
63, 70, 76, 78 Depletion mode transistor
65, 66, 74, 83, 85 Enhancement mode transistor
68, 71, 79 Diode
90 Amplification circuit output terminal
100 Heterojunction chip block
110a, 110b, 120, 130 Heterojunction chip In this disclosure, unless explicitly specified, the heterojunction transistor may be any known transistor based on a heterojunction such as a p-Gate HEMT transistor, or a Schottky gate transistor or an insulated gate transistor such as MISFET (Metal Insulating Semiconductor Field Effect Transistor). The diodes can be Schottky diodes, Zenner diodes or pn diodes or diodes made of a transistor by connecting the source terminal with the drain terminal. The heterojunction chip or the heterojunction power device described in this disclosure can be referred to as a heterojunction smart power device or heterojunction smart chip or heterojunction power integrated circuit or heterojunction integrated circuit.

The skilled person will understand that in the preceding description and appended claims, positional terms such as 'top', 'above', 'overlap', 'under', 'lateral', etc. are made with reference to conceptual illustrations of a device, such as those showing standard cross-sectional perspectives and those shown in the appended drawings. These terms are used for ease of reference but are not intended to be of limiting nature. These terms are therefore to be understood as referring to a device when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the disclosure, whether alone or in any appropriate combination with any other feature disclosed or illustrated herein.

Many other effective alternatives will occur to the person skilled in the art. It will be understood that the disclosure is not limited to the described embodiments, but encompasses all the modifications which fall within the spirit and scope of the disclosure.

The invention claimed is:

1. A III-nitride semiconductor based heterojunction power device comprising:
   a first heterojunction transistor formed on a substrate, the first heterojunction transistor comprising:
     a first III-nitride semiconductor region formed over the substrate, wherein the first III-nitride semiconductor region comprises a first heterojunction comprising at least one two dimensional carrier gas of the second conductivity type;
     a first terminal operatively connected to the first III-nitride semiconductor region;
     a second terminal laterally spaced from the first terminal and operatively connected to the first III-nitride semiconductor region;
     a first gate region being formed over the first III-nitride semiconductor region, and between the first terminal and the second terminal; and
   a second heterojunction transistor formed on the substrate, the second heterojunction transistor comprising:
     a second III-nitride semiconductor region formed over the substrate, wherein the second III-nitride semiconductor region comprises a second heterojunction comprising at least one two dimensional carrier gas of the second conductivity type;
     a third terminal operatively connected to the second III-nitride semiconductor region;
     a fourth terminal laterally spaced from the third terminal in the first dimension and operatively connected to the second III-nitride semiconductor region;
     a first plurality of highly doped semiconductor regions of a first conductivity type formed over the second III-nitride semiconductor region, the first plurality of highly doped semiconductor regions being formed between the third terminal and the fourth terminal;
     a second gate region operatively connected to the first plurality of highly doped semiconductor regions,
   wherein one of the first and second heterojunction transistors is an enhancement mode field effect transistor and the other of the first and second heterojunction transistors is a depletion mode field effect transistor.

2. A heterojunction power device according to claim 1, wherein the second gate region is connected to an internal or external ground or a potential that is near ground.

3. A heterojunction power device according to claim 1, wherein the second gate region is connected to a Kelvin terminal connected to the first terminal.

4. A heterojunction chip comprising:
   the III-nitride semiconductor based heterojunction power device comprising the first heterojunction transistor and the second heterojunction transistor of any preceding claim;
   an interface circuit operatively connected with the second heterojunction transistor;
   wherein the interface circuit is monolithically integrated with any of the first or the second heterojunction transistor.

5. A heterojunction chip according to claim 4, wherein the interface circuit is configured to provide one of the following functions: current control function, voltage control function and disable function.

6. A heterojunction chip according to claim 4, wherein the interface circuit comprises one or more current control blocks.

7. A heterojunction chip according to claim 6, wherein the one or more current control blocks comprise a resistive element which comprises a two dimensional electron gas or any existing layer, including metals, from which the heterojunction chip is fabricated.

8. A heterojunction chip according to claim 6, wherein the one or more current control blocks comprise a current source comprising of a low-voltage depletion mode transistor and a resistive element, wherein a source of the low-voltage depletion mode transistor is connected to a first terminal of the resistive element and a gate of the low-voltage depletion mode transistor is connected to a second terminal of the resistive element, such that a second terminal of the resistive element and a drain of the low-voltage depletion mode transistor forms two terminals of each of the current control block.

9. A heterojunction chip according to claim 6, wherein the one or more current control blocks comprise one or more low-voltage diodes, one or more low-voltage transistors with a gate connected to a source or a low-voltage enhancement-mode transistor with a potential divider connected between a drain and source terminal of the enhancement-mode transistor, wherein the midpoint of the potential divider is connected to the gate terminal of the enhancement mode transistor.

10. A heterojunction chip according to claim 6, wherein the one or more current control blocks comprise a low-voltage depletion mode transistor or an enhancement mode transistor in series or in parallel to a resistive element in a current source wherein a gate of said transistor is connected to a node within the integrated pull-down circuit of the regulator and disable unit.

11. A heterojunction chip according to claim 4, wherein the integrated interface circuit comprise one or more regulators to regulate an output voltage to a level required by an internal or external load or to provide an appropriate DC voltage as a supply rail to any of the low-voltage circuitry inside the heterojunction chip or outside the heterojunction chip.

12. A heterojunction chip according to claim 11, wherein the regulator and disable unit comprises one or more auxiliary low-voltage heterojunction transistors with a drain, source and gate;
   wherein the auxiliary gate region terminal of the auxiliary low-voltage heterojunction transistor is operatively connected to a current control circuit and a pull-down circuit.

13. A heterojunction chip according to claim 4, wherein the integrated interface circuit comprises one or more disable units which are controlled by internal or external signals in order to disable the start-up supply by turning-off or reducing the current through the second heterojunction transistor (start-up device) in order to reduce the power consumption.

14. A heterojunction chip according to claim 12, wherein the pull-down circuit comprises one or more normally-on or normally-off transistors in parallel or in series and several resistors, potential dividers or capacitors.

15. A heterojunction chip according to claim 12, wherein the pull-down circuit comprises a monolithically integrated temperature compensated block of components comprises a resistor in parallel with a series combination between a resistor and a low-voltage heterojunction transistor, such that, when used in conjunction with a potential divider circuit, it provides a circuit behaviour that is less affected by variations in the temperature.

16. A heterojunction chip according to claim 4, further comprising additional capacitors, each forming a capacitance to a third terminal, integrated before and/or after each of the current control blocks and regulator and disable units.

* * * * *